US007260016B2

(12) United States Patent
Kouno

(10) Patent No.: US 7,260,016 B2
(45) Date of Patent: Aug. 21, 2007

(54) NON-VOLATILE SEMICONDUCTOR MEMORY DEVICE AND WRITING METHOD THEREFOR

(75) Inventor: Kazuyuki Kouno, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 86 days.

(21) Appl. No.: 11/085,575

(22) Filed: Mar. 22, 2005

(65) Prior Publication Data

US 2005/0207259 A1 Sep. 22, 2005

(30) Foreign Application Priority Data

Mar. 22, 2004 (JP) ............................. 2004-081988

(51) Int. Cl.
*G11C 16/24* (2006.01)

(52) U.S. Cl. ........................... 365/230.04; 365/185.22; 365/285.23

(58) Field of Classification Search ............ 365/230.04
See application file for complete search history.

(56) References Cited

U.S. PATENT DOCUMENTS

| | | | | |
|---|---|---|---|---|
| 5,293,350 | A | * | 3/1994 | Kim et al. ................ 365/238.5 |
| 6,009,027 | A | * | 12/1999 | Kobatake .................... 365/201 |
| 6,414,874 | B2 | | 7/2002 | Akaogi |
| 6,480,419 | B2 | * | 11/2002 | Lee ........................ 365/185.18 |

FOREIGN PATENT DOCUMENTS

| | | |
|---|---|---|
| JP | 11-121721 | 4/1999 |
| JP | 11-203879 | 7/1999 |
| JP | 11-328981 | 11/1999 |
| JP | 2001-229684 | 8/2001 |
| JP | 2002-203393 | 7/2002 |

* cited by examiner

*Primary Examiner*—Tan T. Nguyen
(74) *Attorney, Agent, or Firm*—McDermott Will & Emery LLP

(57) ABSTRACT

To provide a non-volatile semiconductor memory device which can increase the speed of a writing operation of a physical checker pattern, a logical checker pattern, etc. carried out in an inspection process.

First group writing circuits 30*a*, 30*c* connected to even-numbered bit lines BL0, BL2 and second group writing circuits 30*b*, 30*d* connected to odd-numbered bit lines BL1, BL3 are controlled to an active state and a non-active state respectively on the basis of control signals TSE, TSO. The writing operation of the physical checker pattern is carried out by a program operation for a first page which is carried out while a first word and the first group writing circuits are set to the active state, a program operation for a second page which is carried out while a second word line and the second group writing circuits are set to the active state, and a simultaneous verify operation of the first and second pages which is carried out while the first and second word lines and all the writing circuits are set to the active state.

17 Claims, 15 Drawing Sheets

FIG. 6(a)  FIG. 6(b)
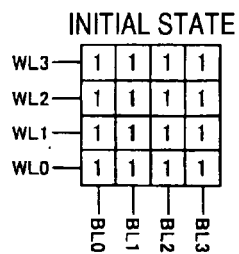
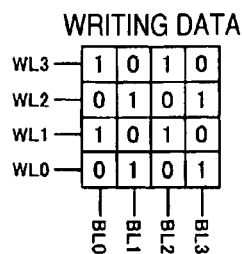
FIG. 6(c)  FIG. 6(d)  FIG. 6(e)
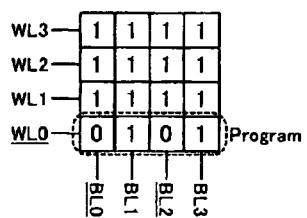
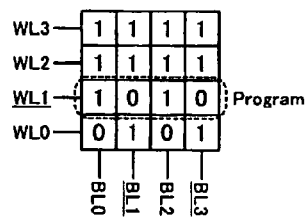
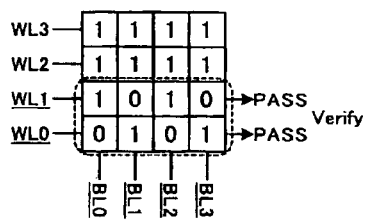
FIG. 6(f)  FIG. 6(g)  FIG. 6(h)
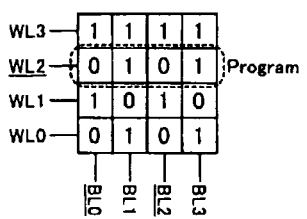
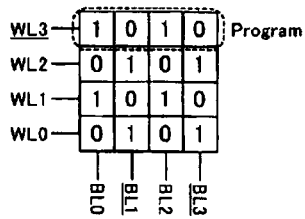
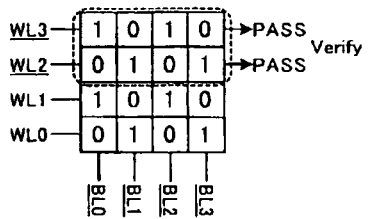

FIG. 10(a) INITIAL STATE

FIG. 10(b) WRITING DATA

FIG. 14(a) INITIAL STATE — WL0–WL3 all 1s across SBL0–SBL15

FIG. 14(b) WRITING DATA — pattern 0,1,0,1,1,0,1,0,0,1,0,1,1,0,1,0 on all of WL0–WL3

FIG. 14(c) Program — WL1–WL3 all 1s; WL0: 0,1,1,1,1,1,1,1,0,1,1,1,1,1,1,1

FIG. 14(d) Program — WL1–WL3 all 1s; WL0: 0,1,1,1,0,1,1,0,1,1,1,1,0,1,1

FIG. 14(e) Verify — WL1–WL3 all 1s; WL0: 0,1,1,1,1,0,1,1,0,1,1,1,0,1,1

NON-VOLATILE SEMICONDUCTOR MEMORY DEVICE AND WRITING METHOD THEREFOR

BACKGROUND OF THE INVENTION

1. Field of the Invention

The present invention relates to an electrically data-rewritable non-volatile semiconductor memory device, and particularly to a non-volatile semiconductor memory device in which a physical checker pattern, a logical checker pattern or the like can be written at high speed, and a writing method therefore.

2. Description of the Related Art

Recently, non-volatile semiconductor memory devices, particularly flash memories have been broadly used in various fields because data are electrically rewritable in the flash memories and also data can be held even when power is turned off. For example, they are used as storage devices for storing data in portable terminals such as cellular phones, digital cameras, silicon audio players, etc. Furthermore, a flash memory is also used as a rewritable program storing area in a system LSI such as a microcomputer or the like.

In an inspection process of flash memories, it is needed to write a physical checker pattern corresponding to a checkered pattern, a logical checker pattern in which logical values of read-out data are inverted every adjacent bits and also the same bits are inverted every read-out cycle (for example, a pattern in which read-out data is changed like 55h→AAh→55h→AAh) or the like and check whether there is neither short-circuit between adjacent bit lines, adjacent word lines nor interference between adjacent bits.

A writing operation of a physical checker pattern in a conventional flash memory will be described hereunder with reference to the drawings. FIG. 15 is a diagram showing a memory cell array of the conventional flash memory and the construction of a writing circuit, and the same construction is disclosed by Patent Document 1 to Patent Document 5.

In FIG. 15, a memory cell array 10 is an NOR-type flash memory array. Specifically describing, the memory cell array 10 is equipped with word lines WL0 to WL3, bit lines BL0 to BL3 (there is illustrated a case where there are provided four word lines and four bit lines), and the memory cells M00 to M33 are arranged in a matrix form at the cross points of the word lines and the bit lines. The control gates of the memory cells are connected to the word lines WL0 to WL3, the drains are connected to the bit lines BL0 to BL3, the source lines are connected to a source line SL and a substrate is connected to a well line PW. Here, the sources of the memory cells M00 to M33 are connected to the common source line SL, and the substrate is connected to the common well line PW to form one erasure block. Here, an assembly of memory cells connected to the same word line is called as a page. For example, an assembly of memory cells connected to the word line WL0 is called as a page 0, and an assembly of memory cells connected to the word line WL1 is called as a page 1.

A word line driver 20 is a circuit for selecting a word line and applying a predetermined voltage. Writing circuits 1530a to 1530d are connected to the bit lines BL0 to BL3 respectively, and they comprise bit line reset transistors RT, latch circuits L0 to L3, bit line connecting circuits TG and P-channel type transistors P0 and P1. The bit line reset transistors RT are circuits for setting the bit lines to the ground voltage, and they are controlled on the basis of a control signal RS. The latch circuits L0 to L3 are circuits for temporarily storing writing data, and each of them comprises two inverter circuits. A power source of the inverter circuits is connected to a high voltage power source line VPP. Here, when 0-data (program data) is stored from data input nodes IO and/IO, the nodes NL0 to NL3 of the latch circuits are set to H level, and when 1-data (erase data) is stored, the nodes NL0 to NL3 of the latch circuits are set to L level. The bit line connecting circuits TG are circuits for connecting/disconnecting the latch circuits L0 to L3 to/from the bit lines BL0 to BL3, and they are controlled on the basis of a control signal TS.

The P-channel type transistors P0, P1 detect the bit line potential in a verifying operation and rewrite data stored in the latch circuits L0 to L3 when the threshold voltage of the memory cell reaches a predetermined value. The gates of the P-channel type transistors P0 are connected to the bit lines BL0 to BL3 respectively, and the gates of the P-channel type transistors P1 are connected to the output of an inverter INV2 controlled on the basis of a control signal VR. In the verifying operation, the control signal VR is set to H level, and the P-channel type transistors P1 are turned on. At this time, When the bit line potential is reduced to a predetermined voltage or less, the P-channel type transistors P0 are turned on, and the nodes NL0 to NL3 of the latch circuits L0 to L3 are set to L level, that is, rewritten into 1-data (erase data). Therefore, the subsequent program operation is not carried out.

N-channel type transistors N1 are used together with a verify judgment circuit 40, and detect the data stored in the latch circuits L0 to L3 to detect whether the threshold voltages of all the memory cells reach the predetermined value.

The verify judgment circuit 40 is a circuit for detecting that the writing operation of all the memory cells is completed, and controlled on the basis of a control signal NVR. The N-channel type transistors N1 of the writing circuits 1530a to 1530d and the P-channel type transistor P2 of the verify judgment circuit 40 are designed in a wired OR connection structure. During the verify operation, the NVR signal is set to L level, and when 0-data (program data) is stored in at least one bit of the latch circuits L0 to L3, that is, any one of the nodes NL0 to NL3 of the latch circuits is set to H level, some N-channel type transistor N1 is turned on and thus a PASS signal of L level is output. When all the data of the latch circuits L0 to L3 are rewritten into 1-data (erase data) by the verify operation, that is, when all the nodes NL0 to NL3 of the latch circuits are set to L level, all the N-channel type transistors N1 are turned off, and a PASS signal of H level is output. By detecting the PASS signal of H level, the completion of the writing operation can be detected.

A column gate 50 is a circuit for connecting the input data IO, /IO with the latch circuits L0 to L3 of the writing circuits 1530a to 1530d, and it is constructed by column gates YG0 to YG3, and controlled on the basis of control signals CS0 to CS3. A column driver 60 is a circuit for selecting a prescribed column gate.

FIG. 16 is a flowchart showing the writing operation of a physical checker pattern. When the program operation is started (step S1601), data latch is carried out to store writing data of page 0 into the latch circuits L0 to L3 (step S1602). Here, the pattern of the writing data is a physical checker pattern of a checkered pattern, and thus the data to be stored into the latch circuits L0 to L3 repeats each of 0-data and 1-data alternately every bit line like 0-data is stored in the latch circuit L0, 1-data is stored in the latch circuit L1, 0-data is stored in the latch circuit L2 and 1-data is stored in the latch circuit L3. After the data latch is finished, the word line WL0 is selected, the bit line connection circuit TG is set to an active state, the latch circuits L0 to L3 are connected to the bit lines BL0 to BL3 and then the program operation of the page 0 is carried out (step S1603). Accordingly, 0-data is written in the memory cells M00, M02. After the program operation of the page 0 is finished, the verify operation of the page 0 is carried out (step S1604).

When it is judged that the threshold voltage of a memory cell for which the program operation is carried out in the verify operation has reached a predetermined value, the latch data of the latch circuit corresponding to the memory cell concerned is rewritten from 0-data (program data) to 1-data (erase data), and afterwards the program operation is not carried out. On the other hand, when it is detected that the threshold voltage of the memory cell for which the program operation is carried does not reach the predetermined value, the latch data of the latch circuit corresponding to the memory cell concerned remains 0-data (program data), and subsequently the program operation is carried out (step S1605). If it is judged in step S1605 that the program operation of all the memory cells of the page is not completed, the program operation and the verify operation for the page 0 are carried out again, and the steps S1603 to S1605 are repetitively carried out until the program operation of all the memory cells of the page 0 is completed. On the other hand, if it is judged in step S1605 that the program operation of all the memory cells of the page 0 is completed, the processing goes to step S1606 to carry out the program operation of the page 1.

In the program operation of the page 1, data latch is carried out to store writing data of the page 1 into the latch circuits L0 to L3 (step S1606). Here, with respect to the data to be stored into the latch circuits L0 to L3, the inverse data to the data of the page 0 are stored like 1-data is stored in the latch circuit L0, 0-data is stored in the latch circuit L1, 1-data is stored in the latch circuit L2 and 0-data is stored in the latch circuit L3. After the data latch is finished, the word line WL1 is selected, the bit line connecting circuit TG is set to an active state to connect the latch circuits L0 to L3 to the bit lines BL0 to BL3, and the program operation of the page 1 is carried out (step S1607), whereby 0-data is written into the memory cells M11, M13. After the program operation of the page 1 is finished, the verify operation of the page 1 is carried out (step S1608), and it is judged whether the program operation of all the memory cells of the page 1 is completed (step S1609). If it is judged in step S1609 that the program operation of all the memory cells of the page 1 is completed, the processing goes to step S1610. On the other hand, it is judged in step S1609 that the writing operation of all the memory cells of the page 1 is not completed, the program operation and the verify operation of the page 1 are carried out, and the steps S1607 to S1609 are repetitively carried out until the program operation of all the memory cells of the page 1 is completed. When the program operation and the verify operation are carried out over plural cycles and the writing operation of all the memory cells of the page 1 is completed, the program operations of the page 2 and subsequent pages are subsequently carried out (step S1610).

JP-A-2002-203393, JP-A-2001-229684, JP-A-11-328981, JP-A-11-203879, JP-A-11-121721 are cited as the related art.

However, the conventional non-volatile semiconductor memory device described above has the following problems. Recently, the memory capacity of the non-volatile semiconductor memory device has been increased, and the number of pages is increased in connection with the increase of the memory capacity. Therefore, there is a tendency that the number of writing cycles will be further increased in the future. Increase of the number of writing cycles greatly affects increase of the writing time. The factors for increasing the writing time in connection with the increase of the number of cycles are (1) the data writing time of the flash memory is in micro-second order and thus it is late, and (2) a voltage generating circuit is required to generate voltages needed for the program operation and the verify operation every program operation, verify operation, and thus a voltage output stabilizing setup time is needed until the voltage generating circuit outputs a predetermined voltage and stabilized when each of the program operation and the verify operation is started. Therefore, there is a problem that the program operation and the verify operation are repetitively carried out plural cycles in the writing operation of one page, so that the writing time is increased.

Furthermore, the number of bits of one page (the number of bits to be written in a lump) is increased in connection with the increase of the memory capacity of the non-volatile semiconductor memory device, so that there is a problem that the data latch time in the writing operation of one page is increased. In some recent non-volatile semiconductor memory devices, the data latch time of one page is lengthened to the micro-second order, and thus the increase of the memory capacity greatly affects the increase of the writing time.

As described above, according to the above problems, the writing time of the physical checker pattern, the logical checker pattern in the inspection process is increased, resulting in increase of the inspection cost, that is, the chip cost, and this is not preferable.

SUMMARY OF THE INVENTION

The present invention solves the above problems, and has an object to provide a non-volatile semiconductor memory device which can carry out a data writing operation of a physical checker pattern, a logical checker pattern, etc. at high speed, and a writing method therefor.

In order to solve the above problem, a non-volatile semiconductor memory device of the present invention is equipped with a memory cell array having plural memory cells arranged in a matrix form at the respective cross points of plural word lines and plural bit lines, writing unit disposed every bit line for carrying out a butch writing operation of writing data into pages comprising the plural memory cells, writing unit activation state setter for setting to an active state or non-active state at least one of first group writing unit for carrying out a writing operation of a first group connected to even-numbered bit lines into memory cells and a second group writing unit for carrying out a writing operation of a second group connected to odd-numbered bit lines into memory cells, and word line selector for selecting one or two word lines from the plural word lines. According to this construction, it is possible to carry out the verify operation on plural pages simultaneously in a verify operation by selecting plural word lines and carrying out the verify operation while setting the writing unit of all the groups into the memory cells to the active state, so that the frequency of the verifying operation can be reduced. Furthermore, in order to write writing data of plural pages into the writing circuit to carry out the writing operation, the data latch operation can be carried out on plural pages at all once, and thus the data latch frequency can be reduced. Accordingly, the data writing speed of the physical checker pattern, the logical checker pattern, etc. can be increased.

It is preferable that the word line selector selects word lines which are not adjacent to each other. According to this construction, the interference between the adjacent word lines in the simultaneous verify operation carried out while simultaneously selecting plural word lines can be avoided, and thus there can be performed detection of the short-circuit between the word lines which is the purpose of the writing operation of the physical/logical checker pattern carried out in the inspection process.

Furthermore, a non-volatile semiconductor memory device of the present invention is equipped with a memory cell array having plural memory cells arranged in a matrix form at the respective cross points of plural word lines and plural sub bit lines, plural select gates for connecting plural main bit lines to the plural sub bit lines, writing unit disposed every main bit line for carrying out a butch writing operation of writing data into pages comprising the plural memory cells, writing unit activation state setter for setting to an active state or non-active state at least one of first group writing unit for carrying out a writing operation of a first group connected to even-numbered bit lines into memory cells and a second group writing unit for carrying out a writing operation of a second group connected to odd-numbered bit lines into memory cells, and select gate selector for selecting one or two select gates from the plural select gates. According to this construction, it is possible to carry out the verify operation on plural pages simultaneously in a verify operation by selecting plural select gates and carrying out the verify operation while setting the writing unit of all the groups into the memory cells to the active state, and thus the frequency of the verifying operation can be reduced. Furthermore, in order to write writing data of plural pages into the writing circuit to carry out the writing operation, the data latch operation can be carried out on plural pages at all once, and thus the data latch frequency can be reduced. Accordingly, the data writing speed of the physical checker pattern, the logical checker pattern, etc. can be increased.

It is preferable that the select gate selector selects sub bit lines which are not adjacent to each other. With this construction, the interference between adjacent sub bit lines in the simultaneous verify operation while simultaneously selecting plural select gates can be avoided, and thus there can be performed detection of the short-circuit between the sub bit lines which is the purpose of the writing operation of the physical/logical checker pattern carried out in the inspection process.

The non-volatile semiconductor memory device of the present invention is equipped with a voltage generating circuit for continually generating a voltage needed for the writing operation of writing the first group into memory cells and the writing operation of writing the second group into memory cells. In this construction, the data writing operation of writing the first and second groups into the memory cells is carried out while the voltage needed for the writing operation is continually generated, whereby the writing operation is allowed to be carried out without waiting for the voltage output stabilizing setup time until the output voltage of the voltage generating circuit is stabilized when the data writing of the second group into the memory cells is started, so that the writing operation can be carried out at high speed.

Furthermore, the non-volatile semiconductor memory device of the present invention is further equipped with first detector for detecting completion of the writing operation of the first group, second detector for detecting completion of the writing operation of the second group and writing data setter for setting, on the basis of the outputs of the first and second detector, writing data of a new page to the writing unit of a group for which the writing operation has been completed. According to this construction, when the writing operation of some group is completed, the writing operation of the next page can be started without waiting for completion of the writing operation of all the groups. Therefore, the parallel degree of the writing operation can be enhanced, and the wiring operation speed can be increased.

Still furthermore, the non-volatile semiconductor memory device of the present invention is equipped with first writing data setter for setting writing data to the first group writing means in a lump, second writing data setter for setting writing data to the second group writing unit in a lump, and data setter activation state setter for setting at least one of the first writing data setter and the second writing data setter to an active state or non-active state. According to this construction, the writing data to the first and second groups can be individually or simultaneously set by controlling the active states of the first and second writing data setting means, and thus the writing data can be set at high speed. Furthermore, when the writing operation of some group is completed, the writing operation of the next page can be started without waiting for the completion of the writing operation of all the groups, so that the writing operation speed can be increased.

According to the present invention, in order to carry out the writing operation of writing data of plural pages into the writing circuit, the data latch operation can be carried out on plural pages at all once, and thus the data latch frequency can be reduced. Furthermore, the verify operation is carried out while selecting plural word lines or select gates and setting the writing unit of all the groups to the memory cells to an active state, whereby the simultaneous verify operation of plural pages can be performed, and thus the verify frequency can be reduced. Accordingly, the data writing speed of the physical checker pattern, the logical checker pattern, etc. can be increased.

BRIEF DESCRIPTION OF THE DRAWINGS

FIG. 6 is a diagram showing transition of memory cell data and memory cells to be subjected to a program operation and a verify operation in a writing operation of the physical checker pattern of the non-volatile semiconductor memory device according to the first embodiment of the present invention.

FIG. 10 is a diagram showing transition of memory cell data in the writing operation of the physical checker pattern of the non-volatile semiconductor memory device according to the second embodiment of the present invention and memory cells to be subjected to the program operation and the verify operation.

FIG. 14 is a diagram showing transition of memory cell data in the writing operation of the logical checker pattern and memory cells to be subjected to the program operation and the verify operation in the non-volatile semiconductor memory device according to the third embodiment of the present invention.

DESCRIPTION OF THE PREFERRED EMBODIMENTS

Respective embodiments of the present invention will be described by citing a flash memory as a representative non-volatile semiconductor memory device with reference to the drawings. First, common matters of the respective embodiments of the present invention will be described with reference to FIGS. 1 to 3.

Figure 1:
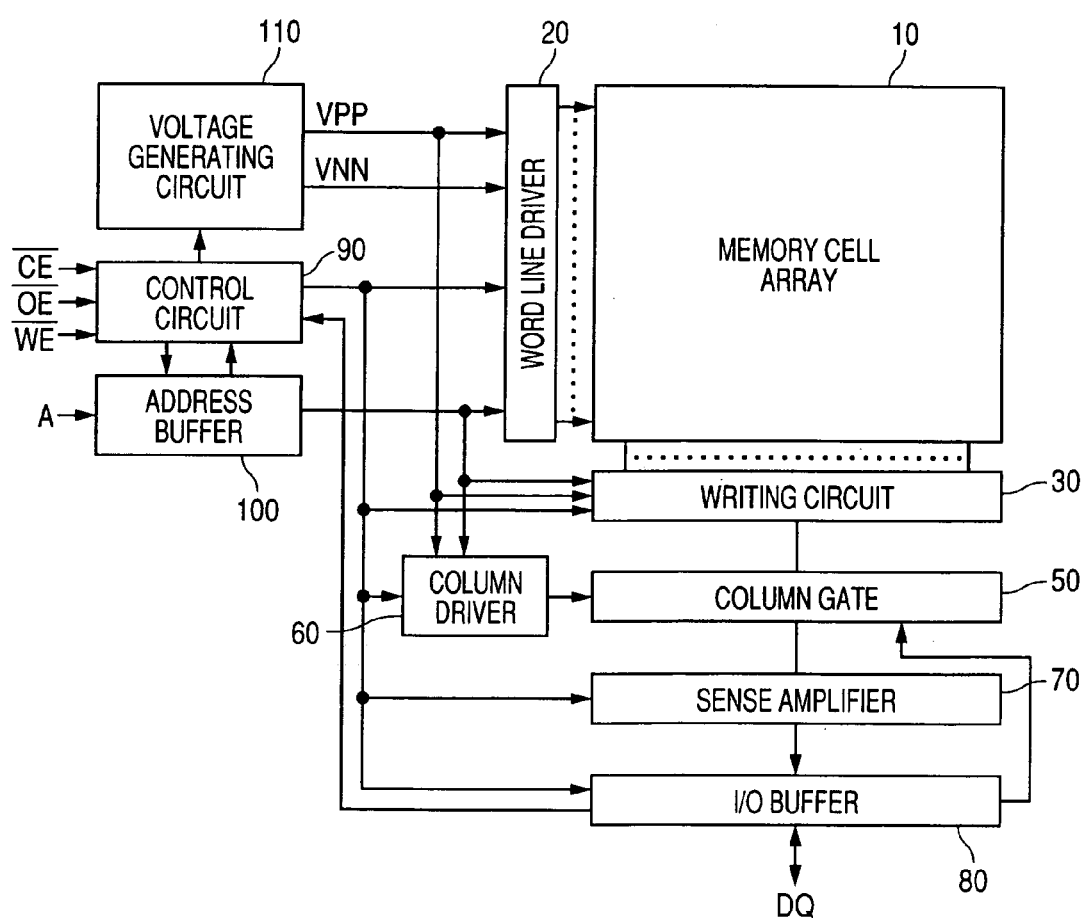
FIG. 1 is a diagram showing the construction of a non-volatile semiconductor memory device according to an embodiment of the present invention.

FIG. 1 is a diagram showing the construction of a flash memory (non-volatile semiconductor memory device) according to each embodiment of the present invention. In FIG. 1, a memory cell array 10 has plural memory cells arranged in a matrix form at the respective cross points of plural word lines and plural bit lines. A word line driver 20 is a circuit for selecting a prescribed word line and applying a predetermined voltage. A writing circuit 30 is disposed every bit line or every plural bit lines, and it is a circuit for temporarily storing writing data to be written into plural memory cells and carrying out a butch writing operation. A column gate 50 is a circuit for selecting a prescribed bit line from the plural bit lines and connecting the prescribed bit line to a sense amplifier 70. Furthermore, it inputs writing data input from an I/O buffer 80 to the writing circuit 30. A column driver 60 is a circuit for selecting a prescribed column gate from the column gate 50. The sense amplifier 70 is a circuit for identifying data stored in memory cells. The I/O buffer 80 is a circuit for delivering data between a data input/output terminal DQ and a flash memory. It outputs output data from the sense amplifier 70 to the data input/output terminal DQ at the reading time, and transmits writing data input from the data input/output terminal DQ to the writing circuit 30 at the data writing time. Furthermore, it transmits commands input from the data input/output terminal DQ to a control circuit 90.

The control circuit 90 is a circuit for controlling the whole of the flash memory, and controls the word line driver 20, the writing circuit 30, the column driver 60, the sense amplifier 70, the I/O buffer 80, an address buffer 100 and a voltage generating circuit 110 to carry out various kinds of control such as reading, writing, erasing operations, etc. To the control circuit 90 are input a chip enable signal/CE, an output enable signal/OE and a writing enable signal/WE which are input from the external, a command input to an address terminal A and output from an address buffer 100, and a command input to the data input/output terminal DQ and output from the I/O buffer 80. The control circuit 90 interprets the command input from the external and executes various kinds of operations of the flash memory.

The address buffer 100 decodes an address input to the address terminal A and transmits signals for selecting desired writing circuit, word line and bit line to the writing circuit 30, the word line driver 20 and the column driver 60 respectively. It further transmits a command input to the address terminal A to the control circuit 90. The voltage generating circuit 110 is a circuit for generating voltages needed for the reading, writing and erasing operations of the flash memory, and it generates a positive high voltage VPP and a negative high voltage VNN.

Figure 2:
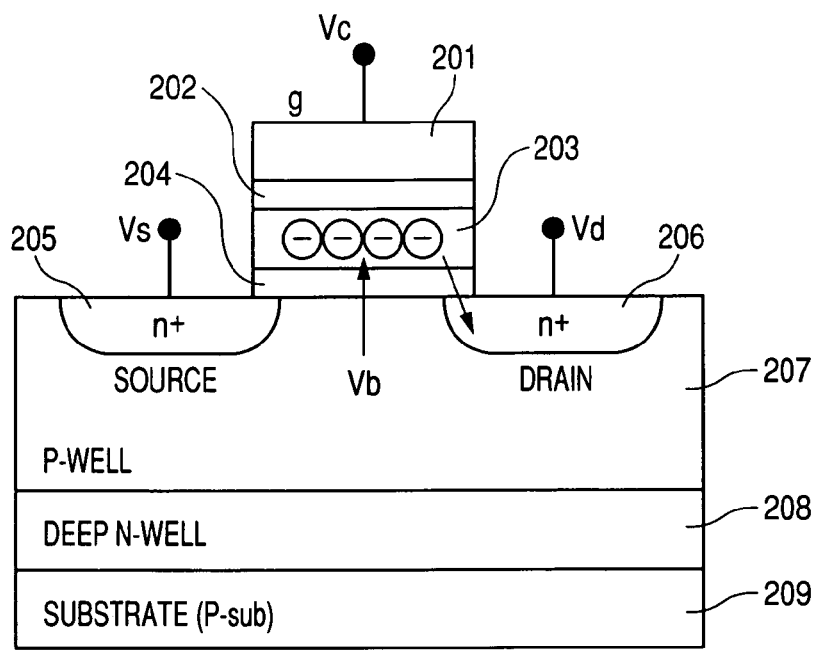
FIG. 2 is a diagram showing the sectional structure of a memory cell used in the non-volatile semiconductor memory device according to the embodiment of the present invention.

FIG. 2 is a diagram showing the cross-sectional structure of each memory cell used for the flash memory (non-volatile semiconductor memory device) according to each embodiment of the present invention. As shown in FIG. 2, a deep N-well 208 and a P-well 207 are formed on a substrate 209, and source 205 and drain 206 of N-type regions are formed in the P-well 207. A floating gate 203 is formed on tunnel oxide film 204, and a control gate 201 is formed through ONO (Oxide-Nitride-oxide) film 202 on the floating gate 203. In the flash memory according to each embodiment of the present invention, high electric field is applied to the tunnel oxide film 204 to generate tunnel current, and electrons are pulled out and doped into the floating gate 203 to control a threshold voltage of the memory cells, thereby carrying out the data writing and erasing operations.

Figure 3:
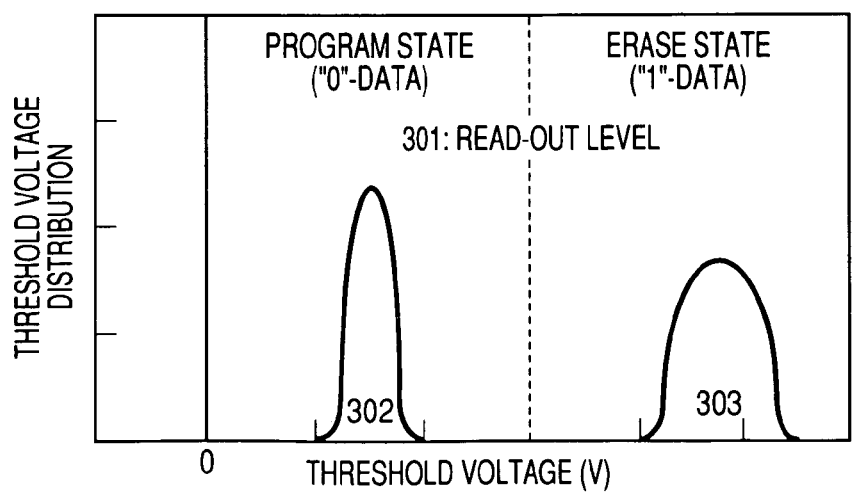
FIG. 3 is a diagram showing a threshold voltage distribution of the memory cell used in the non-volatile semiconductor memory device according to the embodiment of the present invention.

FIG. 3 is a diagram showing a threshold voltage distribution of each memory cell used in the flash memory (non-volatile semiconductor memory device) according to each embodiment of the present invention. In FIG. 3, a state (distribution 302) where the threshold voltage is lower than a read-out level 301 is set as a program state, and a state (distribution 303) where the threshold voltage is higher is set as an erase state. The description will be made by representing data of the program state as "0" data and data of the erase state as "1" data.

The writing operation of the memory cell is carried out by setting the source 205 to an open state and applying, for example, −8V, 5V and the ground voltage (0V) to the control gate 201, the drain 206 and the P-well respectively to pull out electrons accumulated in the floating gate 203. Since the threshold voltage after the writing operation is lower than the read-out level 301, and thus current flows into the memory cell in the reading operation.

The erasing operation of the memory cell is carried out by setting the drain 206 to an open state and applying 5V to the control gate 201 and applying −8V to each of the source 205 and the P-well 207 to dope electrons from the source 205 and the P-well 207 into the floating gate 203. When electrons are doped into the floating gate 203, the threshold voltage of the memory cells is increased. By setting the threshold voltage after the erasure to a value higher than the read-out level 301, current is prevented from flowing to the memory cells in the reading operation.

The reading operation of the memory cell is carried out by applying a read-out voltage to the control gate 201 to set the source 205 and the P-well 207 to the ground potential (0V), judging by using the sense amplifier whether current flows or not under the state that a voltage of about 1V is applied to the drain 206, and then carrying out the reading operation. When current flows in the memory cell, the read-out data is output while it is judged as the program state (0-data), and when no current flows in the memory cell, the read out data is output while it is judged as the erase state (1-data).

(First Embodiment)

Figure 4:
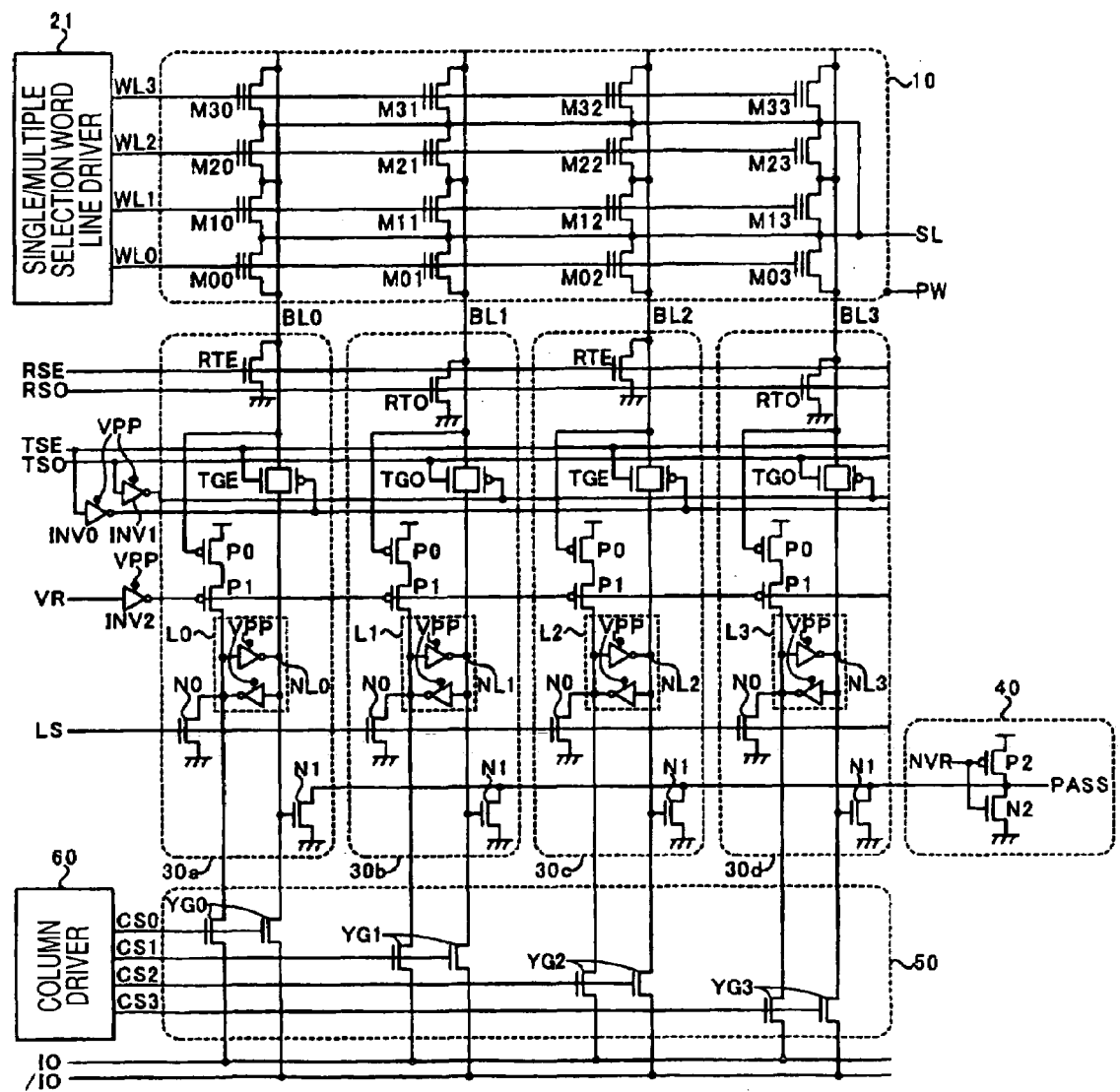
FIG. 4 is a diagram showing a memory cell array and wiring circuits of a non-volatile semiconductor storage device according to a first embodiment of the present invention.
Figure 15:
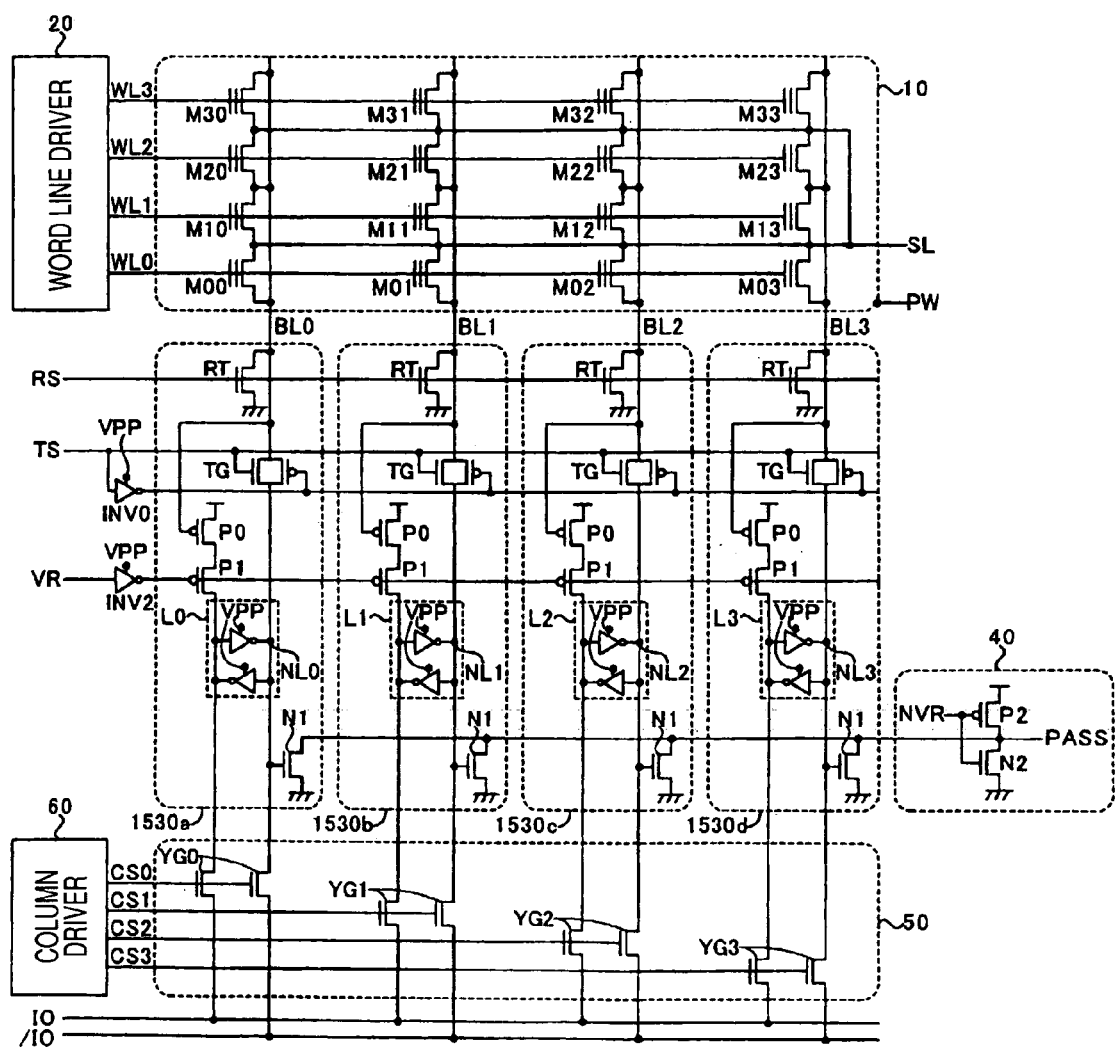
FIG. 15 is a diagram showing the constructions of a memory cell array and writing circuits of a conventional non-volatile semiconductor memory device.
Figure 16:
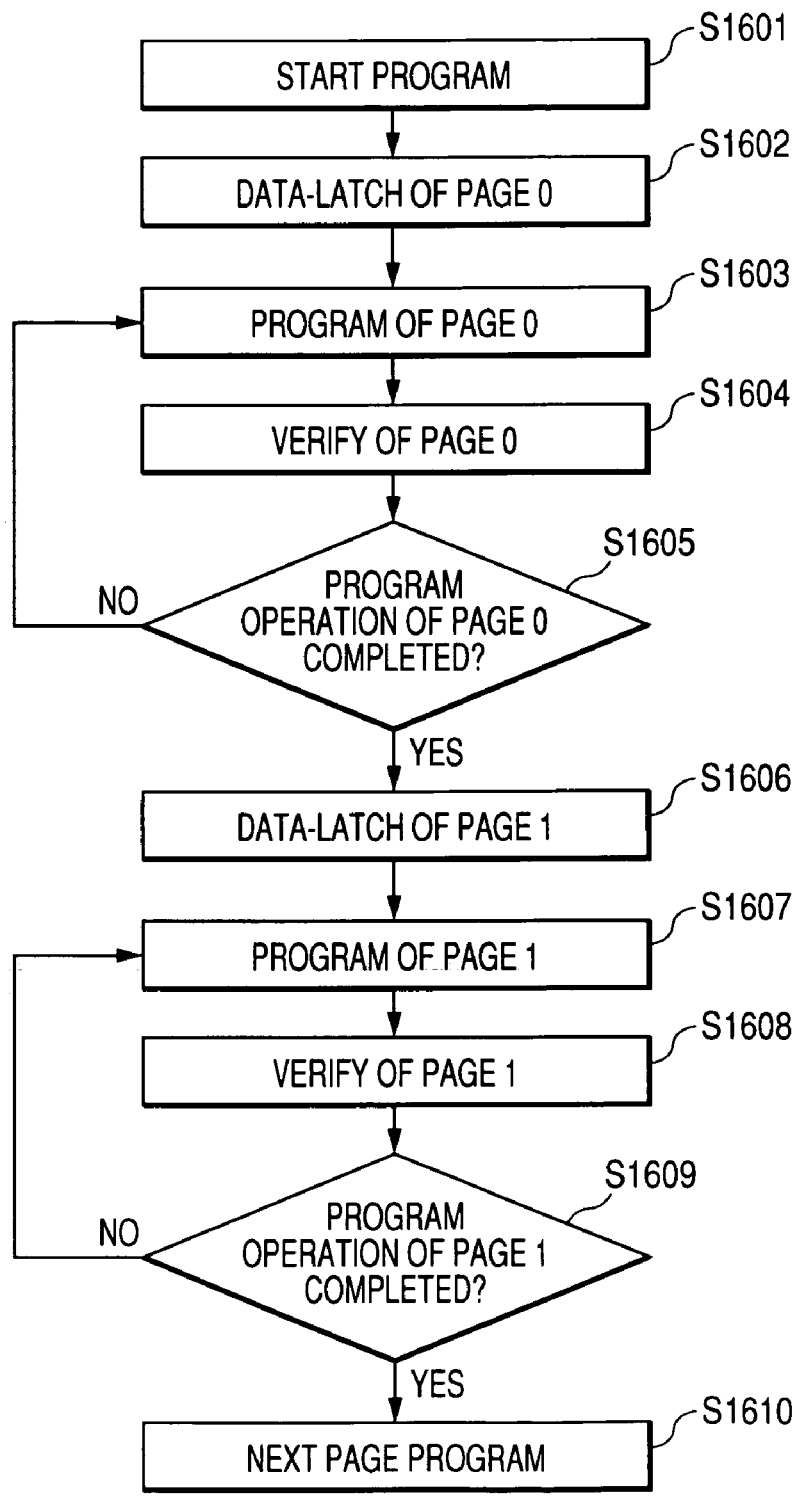
FIG. 16 is a flowchart showing the writing operation of a physical checker pattern of the conventional non-volatile semiconductor memory device.

A flash memory (non-volatile semiconductor memory device) according to a first embodiment of the present invention will be described in detail with reference to FIGS. 4 to 7. FIG. 4 is a diagram showing the construction of a memory cell array and a writing circuit of the flash memory (non-volatile semiconductor memory device) according to the first embodiment. In FIG. 4, the same constituent elements as the background art shown in FIG. 15 are represented by the same reference numerals, and the detailed description thereof is omitted. Only the different portion in construction will be described hereunder.

The different point between FIG. 4 and FIG. 15 showing the background art resides in the construction of the word line driver and the writing circuit. A single/multiple selecting word line driver 21 selects one or two word lines and applies a predetermined voltage. Writing circuits 30a to 30d are connected to bit lines BL0 to BL3 respectively, and each of them comprises a bit line reset transistor RTE, RTO, a latch circuit L0 to L3, a bit line connection circuit TGE, TGO, a latch data setting transistor N0, P-channel type transistors P0, P1 and an N-channel type transistor N1.

The bit line reset transistor RTE, RTO is a circuit for setting the bit line to the ground voltage. The bit line reset transistor RTE for setting the even-numbered bit line BL0, BL2 to the ground voltage is controlled on the basis of a control signal RSE, and the bit line reset transistor RTO for setting the odd-numbered bit line BL1, BL3 to the ground voltage is controlled on the basis of a control signal RSO. As described above, the even-numbered bit line and the odd-numbered bit line can be individually set to the ground voltage.

The bit line connection circuit TGE, TGO is a circuit for connecting/disconnecting the latch circuit L0 to L3 to/from the bit line BL0 to BL3. The bit line connection circuit TGE for connecting/disconnecting the even-numbered bit line BL0, BL2 and the even-numbered latch circuit L0, L2 is controlled on the basis of a control signal TSE, and the bit line connection circuit TGO for connecting/disconnecting the odd-numbered bit line BL1, BL3 and the odd-numbered latch circuit L1, L3 is controlled on the basis of a control signal TSO. As described above, in the even-numbered writing circuit and the odd-numbered writing circuit, the connection/disconnection of the latch circuit and the bit line can be individually controlled on the basis of the control signal TSE, TSO.

The latch data setting transistor N0 is a circuit for setting data stored in the latch circuit L0 to L3 in a lump, and controlled on the basis of a control signal LS. By setting this transistor to an active state, the latch nodes NL0 to NL3 of the latch circuits L0 to L3 are set to H level. That is, 0-data (program data) can be set in a lump.

The writing operation of the physical checker pattern in the non-volatile semiconductor memory device thus constructed will be described.

Figure 5:
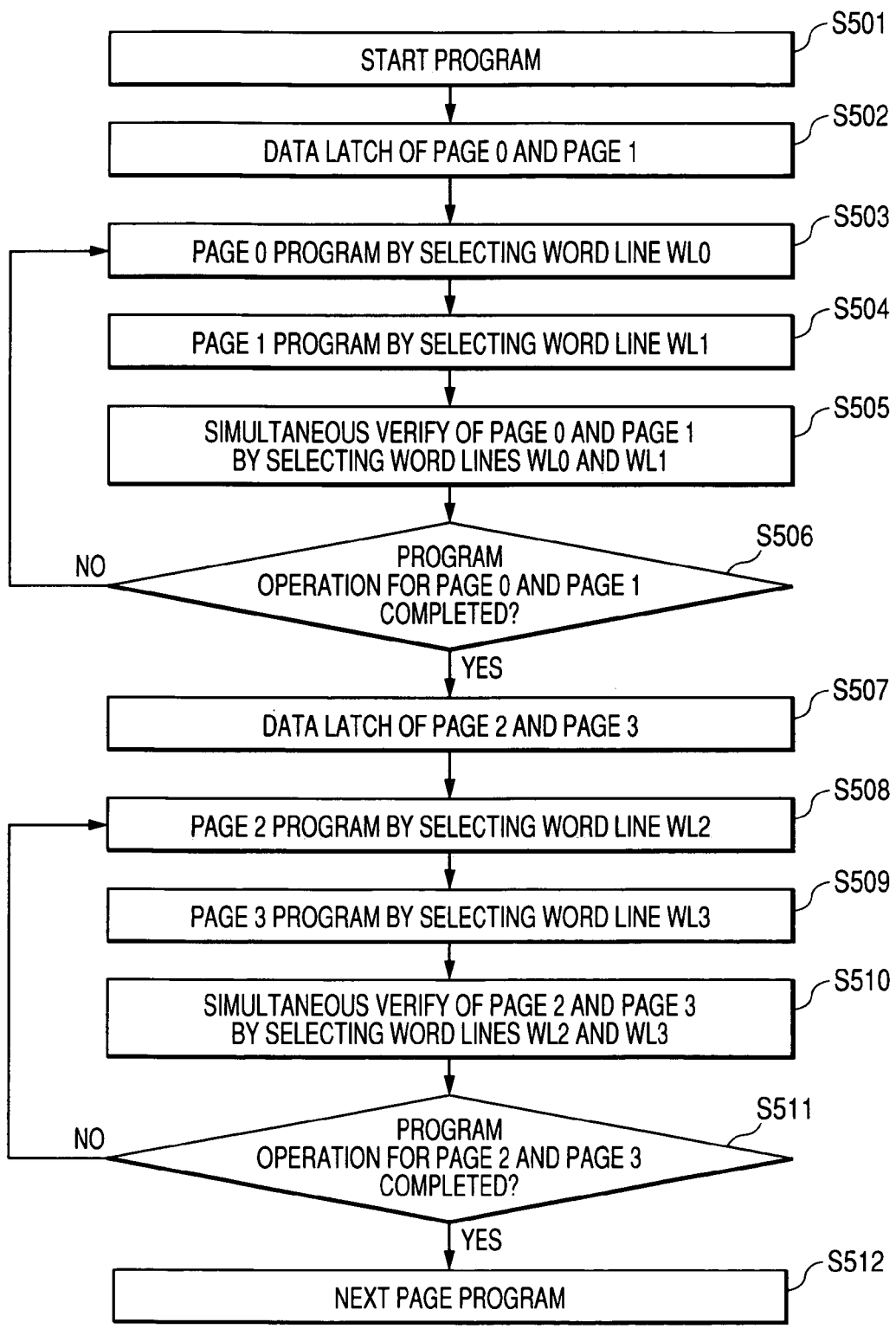
FIG. 5 is a flowchart showing the writing operation of a physical checker pattern of the non-volatile semiconductor memory device according to the first embodiment of the present invention.

FIG. 5 is a flowchart showing the writing operation of the physical checker pattern of the flash memory (non-volatile semiconductor memory device) according to the first embodiment of the present invention, and FIG. 6 shows transition of memory cell data in the writing operation of the physical checker pattern of the flash memory (non-volatile semiconductor memory device) according to the first embodiment of the present invention, and memory cells to be subjected to the program operation and the verify operation. FIG. 6 shows only the memory cells M00 to M33 connected to the word lines WL0 to WL3 and the bit lines BL0 to BL3. As shown in FIG. 6(a), all the data of the memory cell array before the writing operation is carried out are equal to 1-data (erase data). Here, the writing data of the physical checker pattern is a checkered pattern as shown in FIG. 6(b).

Referring to FIG. 5, when the writing operation is started (step S501), the data latch operation of page 0 and page 1 is carried out on the writing circuits 30a to 30d disposed every bit line (step S502). Here, in the conventional non-volatile semiconductor memory device, 0-data (program data) is stored in only the even-numbered or odd-numbered writing circuits, however, in the non-volatile semiconductor memory device of the present invention, 0-data (program data) is stored in all the writing circuits 30a to 30d.

After the data latch operation is finished, the program operation of the page 0 connected to the word line WL0 is carried out (step S503). Here, under the state that the word line WL0 is selected, the even-numbered bit lines BL0, BL2 are connected to the latch circuits L0, L2 under the control of the control signal TSE, only the writing circuits 30a, 30c connected to the even-numbered bit lines are set to an active state, and 0-data (program data) temporarily stored in the latch circuits L0, L2 are written in the memory cells M00, M02 connected to the even-numbered bit lines LB0, BL2. As a result, the program operation is carried out on only the memory cells M00, M02 connected to the even-numbered bit lines BL0, BL2 as shown in FIG. 6(c).

Subsequently, the program operation is carried out on the page 1 connected to the word line WL1 (step S504). Here, under the state that the word line WL1 is selected, the odd-numbered bit lines BL1, BL3 are connected to the latch circuits L1, L3 under the control of the control signal TSO, only the writing circuits 30b, 30d connected to the odd-numbered bit lines are set to an active state, and 0-data (program data) temporarily stored in the latch circuits L1, L3 are written in the memory cells M11, M13 connected to the odd-numbered bit lines BL1, BL3. As a result, as shown in FIG. 6(d), the program operation is carried out on only the memory cells M11, M13 connected to the odd-numbered bit lines BL1, BL3.

After the program operation of the pages 0 and 1 is finished, as shown in FIG. 6(e), all the writing circuits 30a to 30d are set to the active state, the word lines WL0, WL1 are simultaneously selected by the single/multiple selection word line driver 21, and a predetermined voltage is applied, whereby the simultaneous verify operation of the pages 0 and 1 is carried out (step S505). Here, the two word lines WL0, WL1 are simultaneously selected to carry out the verify operation, and thus memory cells of two bits per bit line are targeted to the verify operation. For example, with respect to the bit line BL0, the memory cells M00, M10 are simultaneously selected as memory cells to be verified. However, the writing data pattern of this embodiment is a checkered physical checker pattern, and thus even when memory cells of two bits are selected, the memory cell of 0-data (program data) is only one bit. Accordingly, it is possible to carry out the verify operation of page 0 and page 1 based on the simultaneous selection of the word lines WL0, WL1. That is, the writing circuit 30a carries out the verify operation on the memory cell M00 of the page 0, the writing circuit 30b carries out the verify operation of the memory cell M11 of the page 1, the writing circuit 30c carries out the verify operation of the memory cell M02 of the page 0, and the writing circuit 30d carries out the verify operation of the memory cell M13 of the page 1. The judgment as to the simultaneous verify operation of the pages 0 and 1 is carried out by a verify judging circuit 40 (step S506).

If it is judged in step S506 that the program operation of all the memory cells of the pages 0 and 1 is not completed, the program operation and simultaneous verify operation of the pages 0 and 1 are carried out again, and the steps S503 to S506 are repetitively executed until the program operation of all the memory cells of the pages 0 and 1 is completed. On the other hand, if it is judged in step S506 that the program operation of all the memory cells of the pages 0 and 1 has been completed, the processing goes to step S507, and the program operation of page 2 and page 3 is carried out.

The writing operation of the pages 2 and 3 is the same as the writing operation of the pages 0 and 1. First, 0-data (program data) is stored in all the writing circuits 30a to 30d. Subsequently, the word line WL2 is selected, only the even-numbered writing circuits 30a, 30c are set to the active state, and then the program operation of the page 2 is carried out (step S508). As a result, as shown in FIG. 6(f), the program operation is carried out on only the memory cells M20, M22 connected to the even-numbered bit lines BL0, BL2. Subsequently, the word line WL3 is selected, only the odd-numbered writing circuits 30b, 30d are set to the active state and then the program operation of the page 3 is carried out (step S509). As a result, as shown in FIG. 6(g), the program operation is carried out on only the memory cells M31, M33 connected to the odd-numbered bit lines BL1, BL3. Finally, as shown in FIG. 6(h), the word lines WL2, WL3 are simultaneously selected, all the writing circuits 30a to 30d are set to the active state and then the simultaneous verify operation of the pages 2 and 3 is carried out (steps S510, S511).

If it is judged in step S511 that the program operation of all the memory cells of the pages 2 and 3 is not completed, the program operation and the simultaneous verity operation of the pages 2 and 3 are carried out again, and the steps S508 to S511 are repetitively executed until the program operation of all the memory cells of the pages 2 and 3 is completed. On the other hand, if it is judged in step S511 that the program operation of all the memory cells of the pages 2 and 3 has been completed, the processing goes to step S512, and the program operation of the next page is carried out. By carrying out the above-described operations on all the word lines, the writing operation of the physical checker pattern is carried out on the memory cell array.

Figure 7:
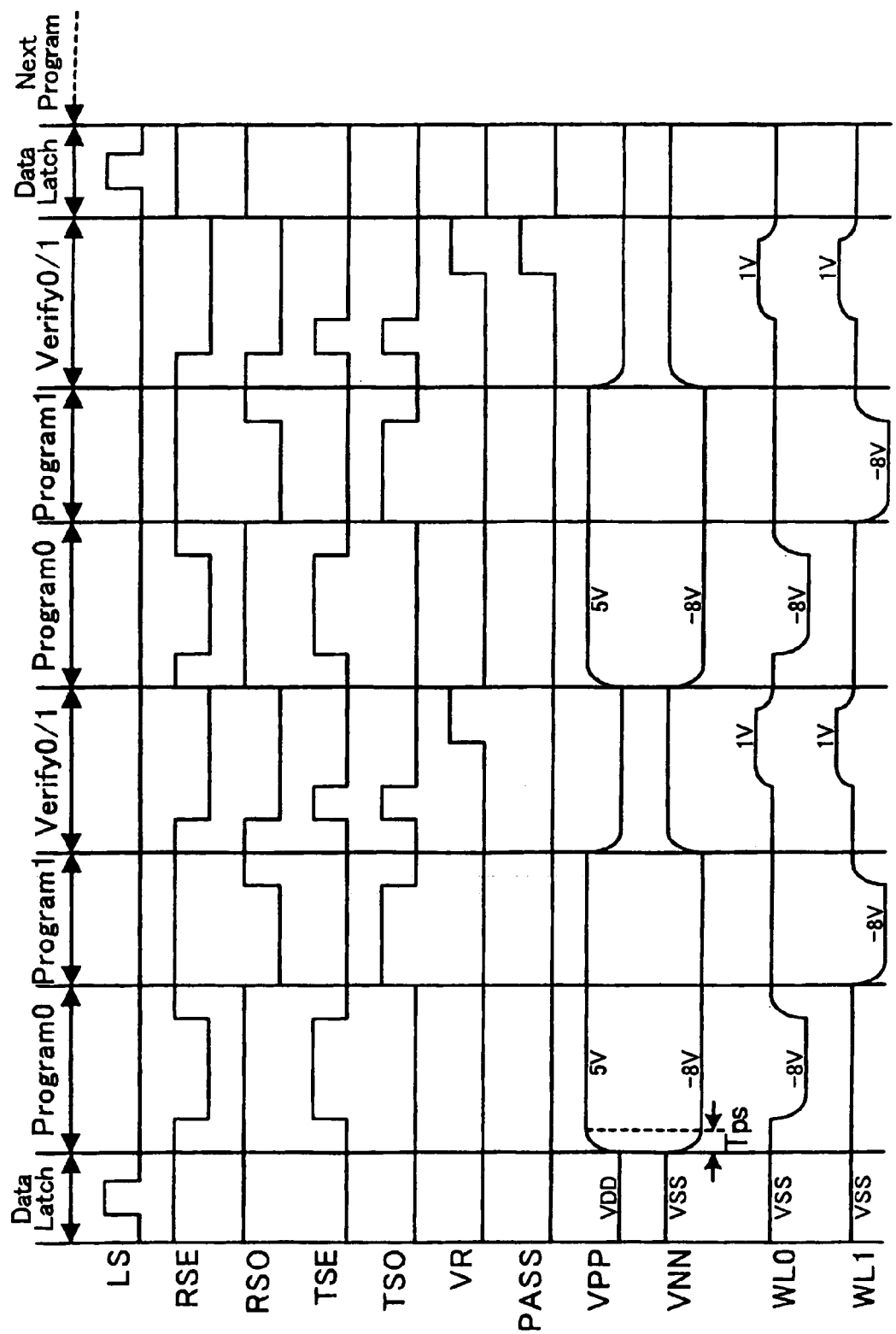
FIG. 7 is a timing chart showing the writing operation of the physical checker pattern of the non-volatile semiconductor memory device according to the first embodiment of the present invention.

FIG. 7 is a timing chart showing the writing operation of the flash memory (non-volatile semiconductor memory device) according to the first embodiment of the present invention. In order to carry out the writing operation of the pages 0 and 1, first, the control signal LS is set to H level, and 0-data (program data) is stored in all the latch circuits L0 to L3. Accordingly, the nodes NL0 to NL3 of the latch circuits L0 to L3 are set to H level. During data latch, the word lines WL0 to WL3, the source line SL and the well line PW are set to the ground voltage. Furthermore, the bit line connection circuits TGE, TGO are set to the non-active state, the bit line reset transistors RTE, RTO are set to the active state, and the bit lines are set to the ground voltage.

After the data latch, the processing is shifted to a program mode, and the voltage generating circuit 110 generates high voltages of 5V and −8V needed for the program operation. After the output voltages VPP, VNN of the voltage generating circuit 110 reach predetermined voltages (after time Tps), −8V is applied to the word line WL0, the source line SL is set to a high impedance state, the bit line reset transistors RTE connected to the even-numbered bit lines BL0, BL2 are set to the non-active state, the bit line connection circuits TGE connected to the even-numbered bit lines BL0, BL2 are set to the active state, and then the output nodes NL0, NL2 of the latch circuits L0, L2 are connected to the bit lines BL0, BL2 to thereby start the program operation. Here, since the output nodes NL0, NL2 of the latch circuits L0, L2 are set to H level, a positive high voltage 5V is applied to the bit lines BL0, BL2. Accordingly, the program operation is carried out on the memory cells M00, M02. Here, 0-data (program data) is also stored in the latch circuits L1, L3 of the odd-numbered bit lines BL1, BL3, however, the bit line connection circuit TGO is set to the non-active state and the bit line reset transistor RTO is set to the active state, so that the ground voltage is applied to the bit line BL1, BL3 and thus no program operation is carried out on the memory cells M01, M03. After the program is carried out for a predetermined time, the word line WL0 and the source line SL are set to the ground voltage, the bit line connection circuit TGE is set to the non-active state, the bit line reset transistor RTE is set to the active state, and then the bit lines BL0, BL2 are set to the ground voltage, thereby finishing the program operation of the page 0.

Subsequently, the voltage generating circuit 110 is continually operated, and the program operation of the page 1 is carried out while keeping the outputs of the high voltages VPP, VNN. As described above the voltage generating circuit 110 is continually operated and the program operation of the page 1 is carried out while keeping the outputs of the high voltages VPP, VNN, so that the program operation of the page 1 can be performed without waiting for the output stabilization setup time (time Tps) of the voltage generating circuit, and the writing operation speed can be increased.

The word line WL1 of the page 1 is set to −8V, the source line SL is set to a high impedance state, the bit line reset transistors RTO connected to the odd-numbered bit lines BL1, BL3 are set to the non-active state, the bit line connection circuits TGO connected to the odd-numbered bit lines BL1, BL3 are set to the active state, the output nodes NL1, NL3 of the latch circuits L1, L3 are connected to the bit lines BL1, BL3 and then the program operation is started. Here, the output nodes NL1, NL3 of the latch circuits L1, L3 are set to H level, and thus a high voltage of 5V is applied to the bit lines BL1, BL3. Accordingly, the program operation is carried out on the memory cells M11, M13. Here, 0-data (program data) is also stored in the latch circuits L0, L2 of the even-numbered bit lines BL0, BL2. However, the bit line connection circuits TGE are set to the non-active state and the bit line reset transistors RTE are set to the active state, so that the ground voltage is applied to the bit lines BL0, BL2, and no program operation is carried out on the memory cells M10, M12. After the program is executed for a predetermined time, the word line WL1 and the source line SL are set to the ground voltage, the bit line connection circuits TGO are set to the non-active state, the bit line reset transistors RTO are set to the active state and the bit lines BL1, BL3 are set to the ground voltage, thereby finishing the program operation of the page 1.

Subsequently, the simultaneous verify operation is carried out on the pages 0 and 1. Shifting to the verify mode, the voltage generating circuit 110 generates a power source voltage VDD and a ground voltage VSS. After the output voltages VPP, VNN of the voltage generating circuit 110 reach predetermined voltages, all the bit line reset transistors RTE, RTO are set to the non-active state, and all the bit line connection circuits TGE, TGO are set to the active state to precharge the power source voltage VDD to only the bit lines corresponding to the program data (the nodes NL0 to NL3 of the latch circuits L0 to L3 are set to H level). After the precharge of the bit lines, all the bit line connection circuits TGE, TGO are set to the non-active state, the latch circuits L0 to L3 are separated from the bit lines BL0 to BL3, the word lines WL0 and WL1 are simultaneously selected and a voltage of 1V is applied to them. If the threshold value voltage of the memory cell is less than 1V, discharge of the bit line is carried out through the memory cell, and the bit line is set to the ground voltage. If the threshold voltage of the memory cell is more than 1V, no discharge through the memory cell is carried out, and thus the potential of the bit line keeps the power source voltage VDD. After a predetermined time elapses, the control signal VR is set to H level, and the control signal NVR is set to L level to start the verify operation, whereby the P-channel type transistor P1 is set to the active state, and a bit line potential detecting operation of the P-channel type transistor is carried out.

When the threshold voltage of the memory cell is equal to 1V or less, the bit line is discharged to the ground voltage and thus the P-channel type transistor P0 is turned on, so that the nodes NL0 to NL3 of the latch circuits L0 to L3 are set to L level, that is, the data thereof are rewritten into 1-data (erase data). Accordingly, no program operation is subsequently carried out. If the threshold voltage of the memory cell is equal to 1V or more, the P-channel type transistor P0 is set to OFF-state because the bit line keeps the power source voltage VDD, and the nodes NL0 to NL3 of the latch circuits L0 to L3 keep values before the verify operation. Accordingly, in the subsequent writing operation, the program operation is carried out only memory cells on which the writing operation has not yet been carried out.

Here, if the threshold voltage of the memory cells M00, M02 is equal to 1V or less and thus the writing operation is completed thereon while the threshold voltage of the memory cells M11, M13 is equal to 1V or more and thus the writing operation is not completed thereon, the latch circuits L0, L2 of the writing circuits 30*a*, 30*c* connected to the even-numbered bit lines BL0, BL2 are rewritten into 1-data (erase data). That is, the nodes NL0, NL2 are set to L level. On the other hand, the latch circuits L1, L3 of the writing circuits 30*b*, 30*d* connected to the odd-numbered bit lines BL1, BL3 hold 0-data (program data). That is, the nodes NL1, NL3 are set to H level. Accordingly, the N-channel type transistors N1 of the writing circuits 30*a*, 30*c* connected to the even-numbered bit lines BL0, BL2 are set to OFF-state while the N-channel type transistors N1 of the writing circuits 30*b*, 30*d* connected to the odd-numbered bit lines BL1, BL3 are set to ON-state, and the verify judging circuit 40 outputs a PASS signal of L level. Accordingly, it can be detected that the writing operation is not completed. After a predetermined time elapses, the word lines WL0 and WL1 are set to the ground voltage, the control signal VR is set to L level, the control signal NVR is set to H level, all the bit line reset transistors RTE, RTO are set to the active state, and then the bit lines BL0 to BL3 are set to the ground voltage, thereby finishing the simultaneous verify operation of the pages 0 and 1.

Since the writing operation of the page 1 is not finished, the writing operation of the pages 0 and 1 is carried out again. Here, since the program of the page 0 is completed in the previous writing operation, that is, the latch circuits L0, L2 of the writing circuits 30*a*, 30*c* connected to the even-numbered bit lines BL0, BL2 corresponding to the page 0 in the previous verify operation are rewritten into 1-data (erase data). Therefore, the program operation on the memory cells of the page 0 is not actually carried out. After the program operation of the page 0 and the program operation of the page 1 are carried out, the simultaneous verify operation of the pages 0 and 1 is carried out. Here, when in the second program operation the threshold voltages of the memory cells M00, M02 and the memory cells MN1, M13 are equal to 1V or less and thus the writing operation is completed, the latch circuits L0 to L3 of all the writing circuits 30*a* to 30*d* are rewritten into 1-data (erase data) after the second simultaneous verify operation. That is, the nodes NL0 to NL3 are set to L level. All the N-channel type transistors N1 are set to OFF-state, and the PASS signal of H level is output, whereby it can be detected that the writing operation of the pages 0 and 1 is completed. After the writing operation of the pages 0 and 1, the writing operation of the pages 2 and 3 is carried out subsequently.

In the first embodiment described above, the writing operation is carried out by the program operation and the simultaneous verify operation for two pages connected to adjacent word lines. However, in the actual inspection process, the writing operation is effectively carried out by the program operation and the simultaneous verify operation for two pages connected to word lines which are not adjacent to each other. The reason for this is as follows. One purpose of writing the physical checker pattern in the inspection process is to detect short-circuit between word lines. In the writing operation described above, the adjacent word lines WL0 and WL1 are simultaneously selected to carry out the simultaneous verify operation, and thus it cannot be discriminated whether each of the word lines WL0 and WL1 is selected or the selection is made by the short-circuit between the word lines. Accordingly, the short-circuit between the word lines which is the purpose of the inspection process cannot be detected. By selecting word lines which are not adjacent to each other, the interface between word lines can be avoided, and the above problem can be solved. Accordingly, this embodiment can be used in the inspection process with no problem, the data writing operation speed can be increased, and the inspection time can be shortened.

As described above, according to the non-volatile semiconductor memory device of the first embodiment of the present invention, in the construction that at least one group writing circuits of the first group writing circuits connected to the even-numbered bit lines and the second group writing circuits connected to the odd-numbered bit lines can be set to the active state or the non-active state, with respect to the writing operation of the physical checker pattern, the data writing can be performed as follows. Data latch of program data (0-data) is carried out on all the writing circuits, and then the first word line is selected and only the even-numbered writing circuits are set to the active state to carry out the writing operation of the first page. Thereafter, the second word line is selected, and only the odd-numbered writing circuits are set to the active state to carry out the writing operation of the second page. Thereafter, the first and second word lines are simultaneously selected, and all the writing circuits are set to the active state to carry out the simultaneous verify operation of the first and second pages. Accordingly, in the one data latch operation, the data latch operation for two pages (the first and second pages) can be carried out, and the data latch frequency can be reduced. Furthermore, the simultaneous verify operation of the first and second pages can be performed by one verify operation, and the verify frequency can be reduced. Accordingly, the data writing operation can be made quick.

Furthermore, the first word line and the second word line on which the program operation and the simultaneous verify operation are carried out are set not to be adjacent to each other, whereby it can be possible to carry out the simultaneous verify operation while selecting two word lines which are not adjacent to each other, and detect the short-circuit between the word lines, which is the purpose of the writing of the physical checker patter carried out in the inspection process. Therefore, this embodiment can be used in the inspection process with no problem. Accordingly, the data writing operation speed can be increased, and the inspection time can be shortened.

Furthermore, the voltage generating circuit for generating the voltage needed for the program operation is continually operated, and the writing operation of the first page and the writing operation of the second page are carried out under the state that the voltage needed for the writing operation is continually generated. Therefore, at the start time of the second page writing operation, the writing operation can be performed without waiting for the voltage output stabilization setup time needed until the voltage generating circuit outputs a predetermined voltage and stabilized, whereby the data writing operation speed can be increased.

(Second Embodiment)

A flash memory (non-volatile semiconductor memory device) according to a second embodiment of the present invention will be described in detail with reference to FIGS. 8 to 11. The second embodiment improves the writing operation of the physical checker pattern of the first embodiment. According to the second embodiment, when the writing operation of one of two pages is completed, but the writing operation of the other page is not completed in the writing operation based on the program operation and the simultaneous verify operation of the two pages, the writing operation of a new page and the page for which the writing operation is not completed is carried out, and the data writing operation speed is further increased.

Figure 8:
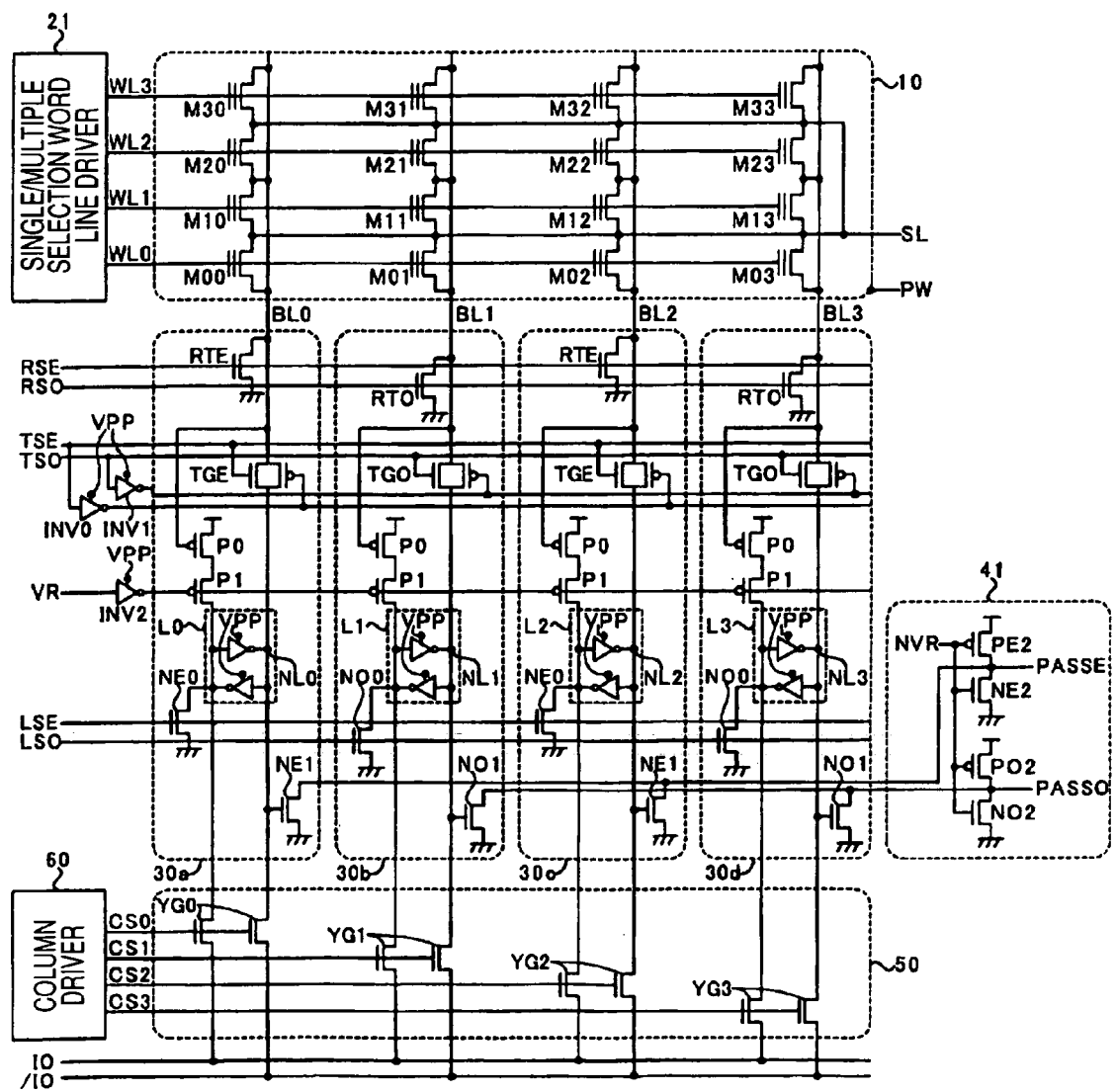
FIG. 8 is a diagram showing the constructions of the memory cell array and the writing circuits of a non-volatile semiconductor memory device according to a second embodiment of the present invention.

FIG. 8 is a diagram showing the construction of a memory cell array and writing circuits of the flash memory (non-volatile semiconductor memory device) according to the second embodiment of the present invention. In FIG. 8, the constituent elements having the same functions as those of the first embodiment shown in FIG. 4 are represented by the same reference numerals and the detailed description thereof is omitted. Only the different construction will be described hereunder.

The different point between FIG. 8 and the first embodiment resides in the constructions of a latch data setting circuit and a verify judging circuit. Latch data setting transistors NE0, NO0 are circuits for collectively setting data to be stored in the latch circuits L0 to L3, and the latch nodes NL0 to NL3 of the latch circuits L0 to L3 are set to H level by setting the transistors to the active state. That is, 0-data (program data) can be set in a lump. The latch data setting transistor NE0 for collectively setting the latch data of the latch circuits L0, L2 connected to the even-numbered bit lines BL0, BL2 is controlled on the basis of a control signal LSE, and the latch data setting transistor NO0 for collectively setting the latch data of the latch circuits L1, L3 connected to the odd-numbered bit lines BL1, BL3 is controlled on the basis of a control signal LSO. As described above, 0-data (program data) can be individually set in the latch circuits in the even-numbered writing circuits 30*a*, 30*c* and the odd-numbered writing circuits 30*b*, 30*d* by the control signals LSE and LSO.

The N-channel type transistors NE1, NO1 are commonly used by the verify judging circuit 41, and it detects data stored in the latch circuits L0 to L3 to detect whether the threshold voltages of all the memory cells reach a predetermined voltage.

The verify judging circuit 41 is a circuit for detecting that the writing operation of all the memory cells is completed in the verify operation, and controlled on the basis of a control signal NVR. The N-channel type transistors NE1 of the writing circuits 30*a*, 30*c* connected to the even-numbered bit lines BL0, BL2 and the P-channel type transistor PE2 of the verify judging circuit 41 are designed in a wired OR connection structure. In the verify operation, the NVR signal is set to L level, and when the even one bit of 0-data (program data) is stored in the latch circuits L0, L2, that is, some of the nodes NL0, NL2 of the latch circuits is set to H level, some of the N-channel type transistors NE1 is set to ON-state, and a PASSE signal of L level is output. When all the data of the latch circuits L0, L2 are rewritten into 1-data (erase data) through the verify operation, that is, when all the nodes NL0, NL2 of the latch circuits are set to L level, all the N-channel type transistors NE1 are set to OFF-state and thus a PASSE signal of H level is output. By detecting the PASSE signal of H level, it can be detected that the writing operation of the even-numbered bit lines BL0, BL2 is completed.

Likewise, the N-channel type transistors NO1 of the writing circuits 30*b*, 30*d* connected to the odd-numbered bit lines BL1, BL3 and the P-channel type transistor PO2 of the verify judging circuit 41 are designed in a wired OR connection structure. In the verify operation, the NVR signal is set to L level, and when even one bit of 0-data (program data) is stored in the latch circuits L1, L3, that is, some of the nodes NL1, NL3 of the latch circuits is set to H level, some N-channel type transistor NO1 is set to ON-state, and the PASSO signal of L level is output. When all the data of the latch circuits L1, L3 are rewritten into 1-data (erase data) by the verify operation, that is, all the nodes NL1, NL3 of the latch circuits are set to L level, all the N-channel type transistors NO1 are set to OFF-state, and the PASSO signal of H level is output. By detecting the PASSO signal of H level, it can be detected that the writing operation of the odd-numbered bit lines BL1, BL3 is completed. As described above, the completion of the writing operation of the even-numbered bit lines BL0, BL2 and the writing operation of the odd-numbered bit lines BL1, BL3 can be individually detected.

The writing operation of the physical checker pattern of the non-volatile semiconductor memory device thus constructed will be described hereunder.

Figure 9:
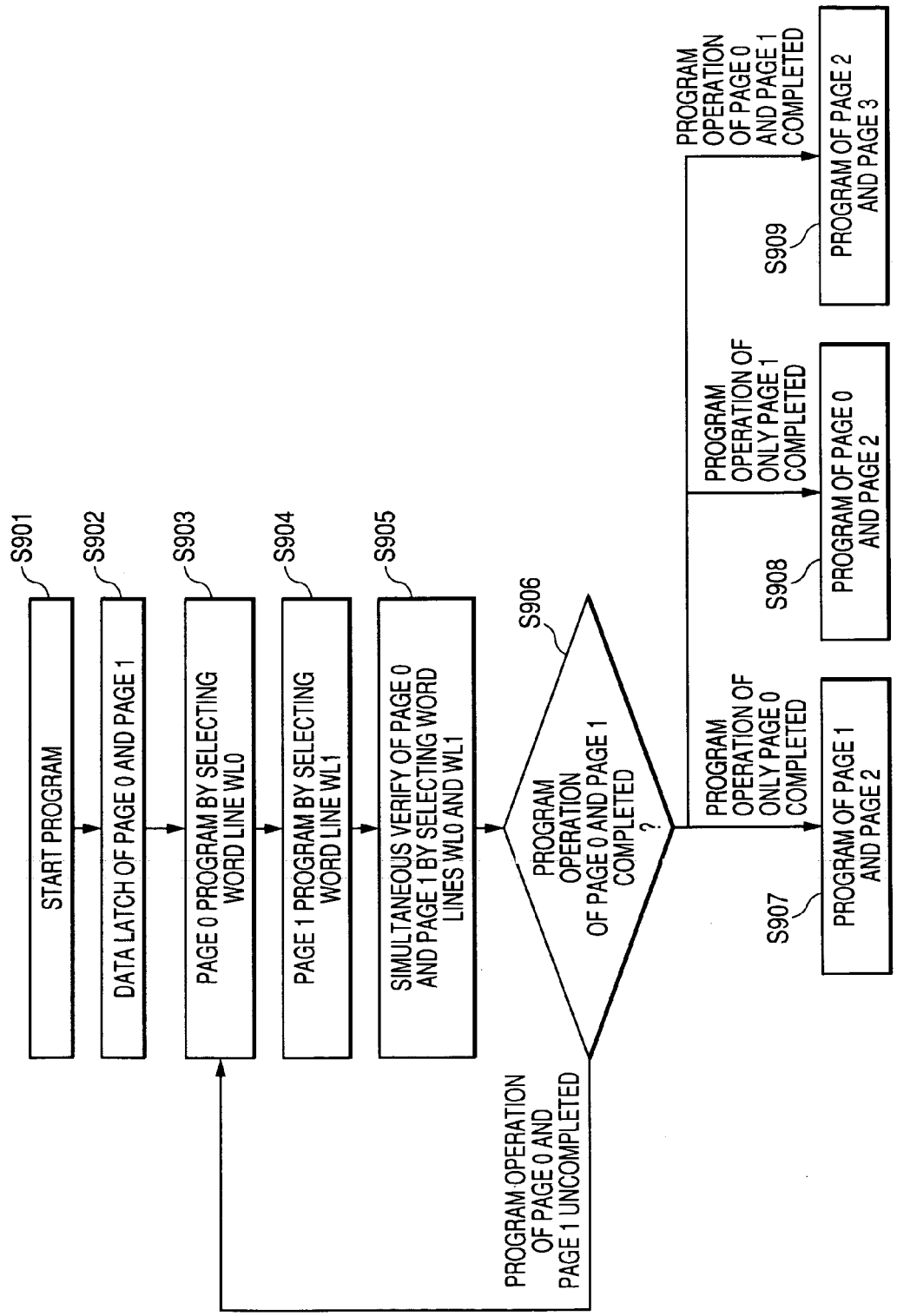
FIG. 9 is a flowchart showing the writing operation of a physical checker pattern in the non-volatile semiconductor memory device according to the second embodiment of the present invention.
Figures 10A, 10B, 10C, 10D, 10E, 10F, 10G, 10H, 10I, 10J, 10K:
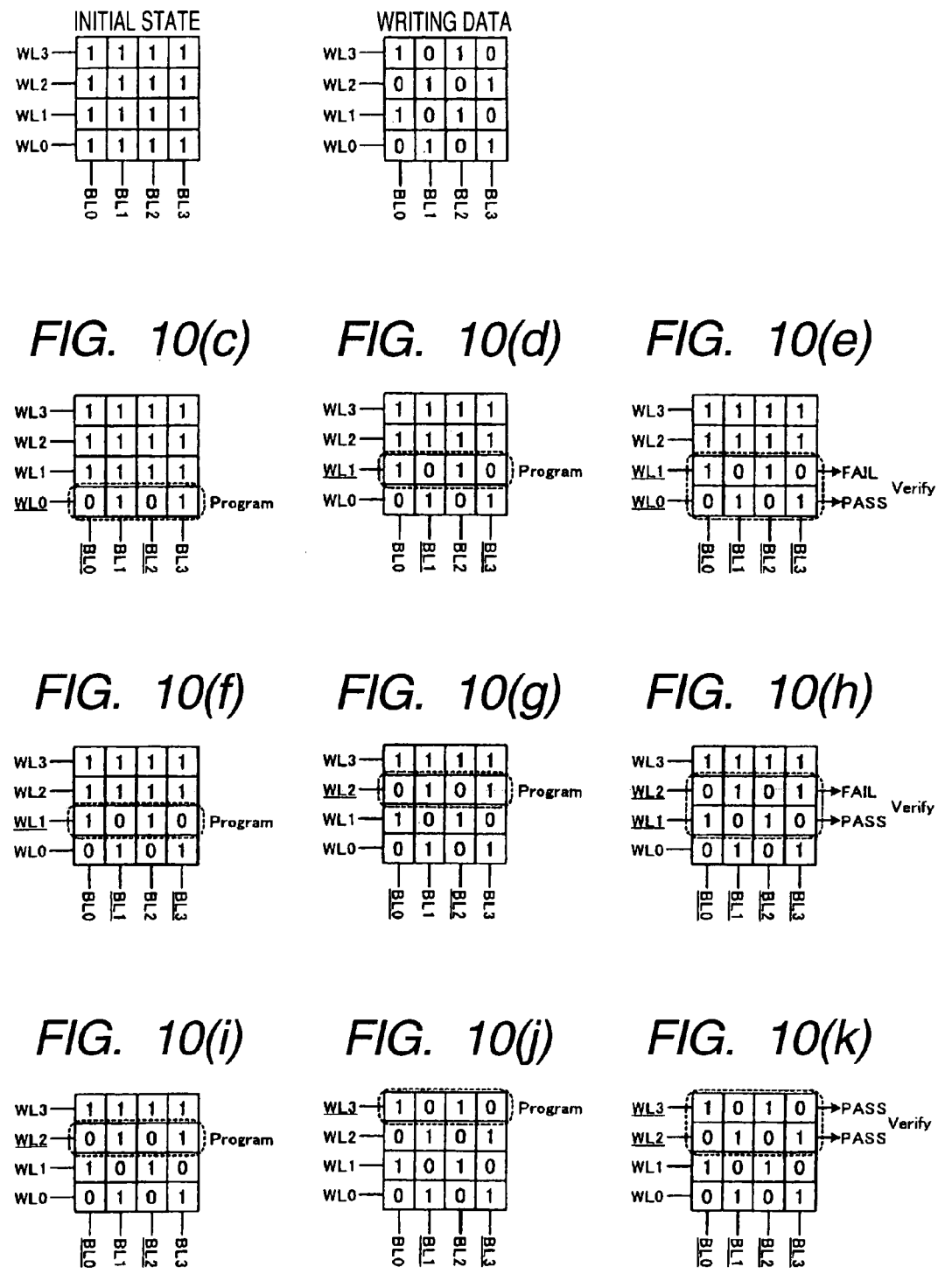

FIG. 9 is a flowchart showing the writing operation of the physical checker pattern of the flash memory (non-volatile semiconductor memory device) according to the second embodiment of the present invention, and FIG. 10 is diagrams showing transition of memory cell data in the writing operation of the physical checker pattern in the flash memory (non-volatile semiconductor memory device) of the second embodiment of the present invention and memory cells to be subjected to the program operation and the verify operation. FIG. 10 shows only the memory cells M00 to M33 connected to the word lines WL0 to WL3 and the bit lines BL0 to BL3. As shown in FIG. 10(a), all the data of the memory cell array before the writing operation is carried out are 1-data (erase data). Here, the writing data of the physical checker pattern is a checkered pattern as shown in FIG. 10(b).

In FIG. 9, the procedure from the start of the program till the program operation and the simultaneous verify operation of pages 0 and 1, that is, the operation of the steps S901 to S905 is the same as the operation of the steps S501 to S505 of FIG. 5 according to the first embodiment, and thus the description thereof is omitted. Furthermore, the transition of the memory cell data shown in FIGS. 10(c) to (e) is identical to that shown in FIGS. 6(c) to (e).

In FIG. 9, after the program operation of pages 0 and 1 is carried out, the simultaneous verify operation of the pages 0 and 1 is carried out, and it is judged whether the program operation of memory cells is completed or not (step S906). It is judged in step S906 that the program operation of the pages 0 and 1 is not completed, the program operation and the simultaneous verify operation of the pages 0 and 1 are carried out again (steps S903 to S906). If it is judged in step S906 that the program operation of the page 0 is completed and the program operation of the page 1 is not completed, the writing operation of the page 1 for which the program operation is not completed and a new page 2 is carried out (step S907). Likewise, if it is judged in step S906 that the program operation of the page 1 is completed and the program operation of the page 0 is not completed, the writing operation of the page 0 for which the program operation is not completed and a new page 2 is carried out (step S908). Furthermore, if it is judged in step S906 that the program operation of the pages 0 and 1 is completed, the writing operation of new pages 2 and 3 is carried out (step S909).

In the following description, there will be described a case where the program operation of the page 0 is completed and the program operation of the page 1 is not completed (the writing operation of the pages 1 and 2 of step S907). In order to carry out the writing operation of the new page 2, the data latch of 0-data (program data) is carried out on the writing circuits 30a, 30c connected to the even-numbered bit lines BL0, BL2 for which the writing operation of the page 0 is completed. At this time, writing data of the page 1 for which the program operation is not completed are stored in the writing circuits 30b, 30d connected to the odd-numbered bit lines BL1, BL3, and thus they are kept unchanged. After the data latch operation is finished, the word line WL1 is selected, only the even-numbered writing circuits 30b, 30d are set to the active state and then the writing operation of the page 1 is carried out. As a result, as shown in FIG. 10(f), the program operation is carried out on only the memory cells M11, M13 connected to the odd-numbered bit lines BL1, BL3.

Subsequently, the word line WL2 is selected, only the even-numbered writing circuits 30a, 30c are set to the active state and then the writing operation of the page 2 is carried out. As a result, as shown in FIG. 10(g), the program operation is carried out on only the memory cells M20, M22 connected to the even-numbered bit lines BL0, BL2. Subsequently, the word lines WL1 and WL2 are simultaneously selected, all the writing circuits 30a to 30d are set to the active state and the simultaneous verify operation of the pages 1 and 2 is carried out. As a result, it is assumed that the writing operation of the memory cells of the page 1 is completed and the writing operation of the memory cells of the page 2 is not completed as shown in FIG. 10(h). The subsequent writing operation is carried out on the page 2 for which the writing operation is not completed and a new page 3.

The writing operation of the pages 2 and 3 is the same as the writing operation of the pages 1 and 2 described above. The data latch of 0-data (program data) is carried out on the writing circuits 30b, 30d connected to the odd-numbered bit lines BL1, BL3 for which the writing operation of the page 1 is completed. At this time, the writing data of the page 2 for which the program operation is not completed are stored in the writing circuits 30a, 30c connected to the even-numbered bit lines BL0, BL2, and thus they are kept unchanged.

After the data latch operation is finished, as shown in FIG. 10(i), the word line WL2 is selected, only the even-numbered writing circuits 30a, 30c are set to the active state, and then the writing operation of the page 2 is carried out. Subsequently, as shown in FIG. 10(j), the word line WL3 is selected, the odd-numbered writing circuits 30b, 30d are set to the active state and then the writing operation of the page 3 is carried out. Subsequently, as shown in FIG. 10(k), the word lines WL2 and WL3 are simultaneously selected, all the writing circuits 30a to 30d are set to the active state and then the simultaneous verify operation of the pages 2 and 3 is carried out. The writing operation of the physical checker pattern is carried out on the memory cell array by carrying out the above operation on all the word lines.

Figure 11:
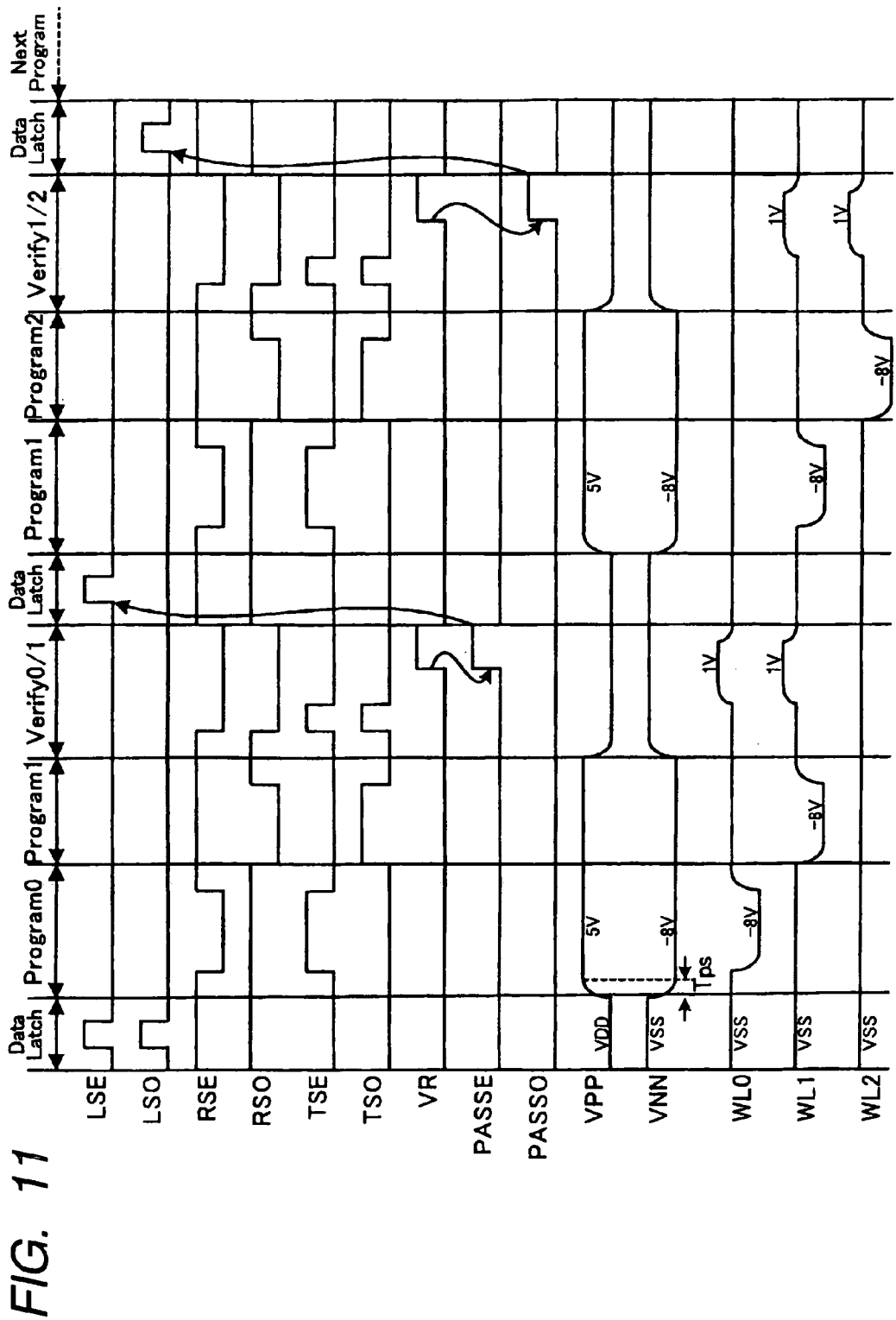
FIG. 11 is a timing chart showing the writing operation of the physical checker pattern of the non-volatile semiconductor memory device according to the second embodiment of the present invention.

FIG. 11 is a timing chart showing the writing operation of the physical checker pattern of the flash memory (non-volatile semiconductor memory device) according to the second embodiment of the present invention. The different point from the physical checker pattern writing operation of the first embodiment will be described hereunder with reference to FIG. 7 showing the first embodiment. The same writing operation is carried out in the first and second embodiments until the program operation of the pages 0 and 1. Here, it is assumed that the threshold voltages of the memory cells M00, M02 of the page 0 are equal to 1V or less and the writing operation thereof is completed while the threshold voltages of the memory cells M11, M13 of the page 1 are equal to 1V or more and the writing operation thereof is not completed. In this case, at the end time of the simultaneous verify operation of the pages 0 and 1, the latch circuits NL0, NL2 of the writing circuits 30a, 30c connected to the even-numbered bit lines BL0, BL2 are rewritten into 1-data (erase data). That is, the nodes NL0, NL2 are set to L level. On the other hand, the latch circuits L1, L3 of the writing circuits 30b, 30d connected to the odd-numbered bit lines BL1, BL3 hold 0-data (program data). That is, the nodes NL1, NL3 are set to H level. Accordingly, all the N-channel type transistors NE1 of the even-numbered writing circuits 30a, 30c are set to OFF-state, and a PASSE signal of H level is output. Accordingly, it can be detected that the writing operation of the writing circuits 30a, 30c connected to the even-numbered bit lines BL0, BL2, that is, the writing operation of the page 0 is completed. On the other hand, all the N-channel type transistors NO1 of the odd-numbered writing circuits 30b, 30d are set to ON-state and a PASSO signal of L level is output. Accordingly, it can be detected that the writing operation of the writing circuits 30b, 30d connected to the odd-numbered bit lines BL1, BL3, that is, the writing operation of the page 1 is not completed.

After the simultaneous verify operation of the pages 0 and 1 is finished, the writing operation of the page 1 for which the writing operation is not completed and the new page 2 is carried out. In order to store the 0-data (program data) in the latch circuits L0, L2 of the even-numbered writing circuits 30a, 30c for which the writing operation is completed, the control signal LSE is set to H level. Accordingly, the nodes NL0, NL2 of the latch circuits L0, L2 are set to H level. After the data latch is finished, the writing operation of the pages 1 and 2 is carried out. This is carried out in the same manner as the writing operation of the pages 0 and 1 described above, and thus the description thereof is omitted.

When the L-level PASSE signal and the H-level PASSO signal are output in the simultaneous verify operation of the pages 1 and 2, that is, when the writing operation of the even-numbered writing circuits 30a, 30c corresponding to the writing circuits of the page 2 is not completed and the writing operation of the odd-numbered writing circuits 30b, 30d corresponding to the writing circuits of the page 1 is completed, the writing operation of the page 2 for which the writing operation is not completed and the new page 3 is carried out. In order to store the 0-data (program data) in the latch circuits L1, L3 of the odd-numbered writing circuits 30b, 30d for which the writing operation is completed, the control signal LSO is set to H level. Accordingly, the nodes NL1, NL3 of the latch circuits L1, L3 are set to H level. Subsequently, the writing operation of the pages 2 and 3 is carried out.

In the second embodiment, the writing operation based on the program operation and the simultaneous verify operation for two pages connected to adjacent word lines is carried out as in the case of the first embodiment. However, it is effective to the actual inspection process to carry out the writing operation based on the program operation and the simultaneous verify operation of two pages connected to word lines which are not adjacent to each other.

As described above, according to the non-volatile semiconductor memory device of the second embodiment of the present invention, when the writing operation of any one group of the first group writing circuits connected to the even-numbered bit lines and the second group writing circuits connected to the odd-numbered bit lines, writing data of a new page are set into the writing circuits of the group for which the writing operation is completed. Accordingly, when the writing operation of any page is completed, the writing operation for the next page can be carried out without waiting for completion of the writing operation of the page for which the writing operation is not completed. Therefore, the parallel degree of the writing operation can be enhanced, and the writing operation speed can be increased. Specifically, by providing the first detector for detecting the completion of the writing operation of the writing circuits connected to the even-numbered bit lines and the second detector for detecting the completion of the writing operation of the writing circuits connected to the odd-numbered bit lines, it can be detected that the writing operation of the writing circuits connected to the even-numbered bit lines and/or the writing operation of the writing circuits connected to the odd-numbered bit lines is completed, and thus the speed of the writing operation can be increased.

Furthermore, there are provided the latch data setter for setting the writing data to the writing circuits connected to the even-numbered bit lines in a lump and the latch data setter for setting the writing data to the odd-numbered bit lines in a lump, and also at least one of the latch data setter can be set to the active state or non-active state, whereby the writing data of a first page and the writing data of a second page can be individually or simultaneously set in a lump, and thus the data latch operation speed can be increased. Still furthermore, when the writing operation of any one of the first and second pages is finished, the writing data of the next page can be set to only the writing circuits for the page for which the writing operation is finished. Therefore, the writing operation of the next page can be carried out without waiting for the completion of the writing operation of the page for which the writing operation is not completed, and thus the writing operation speed can be further increased.

(Third Embodiment)

A flash memory (non-volatile semiconductor memory device) according to a third embodiment of the present invention will be described in detail with reference to FIGS. 12 to 14.

Figure 12:
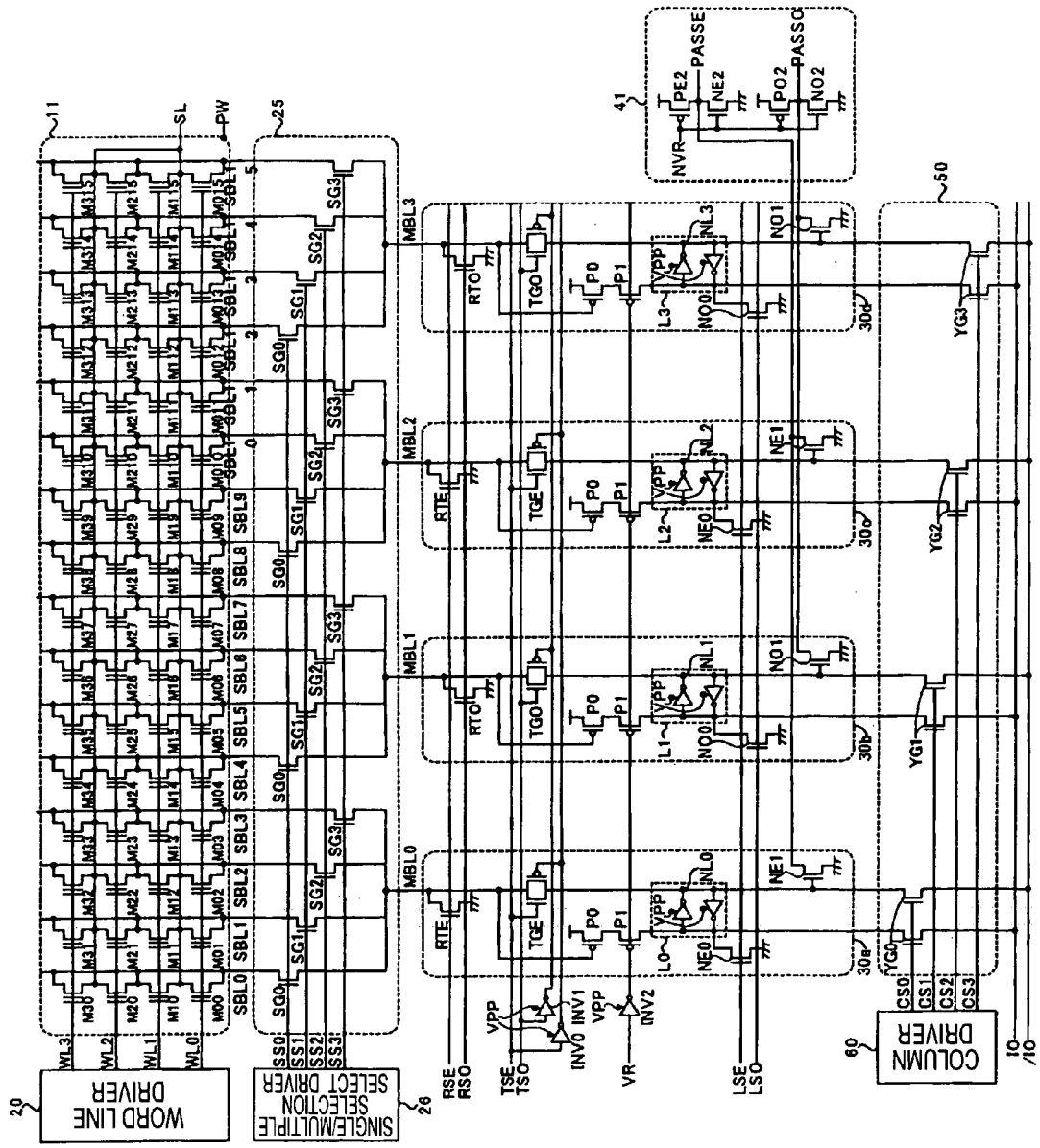
FIG. 12 is a diagram showing the constructions of a memory cell array and writing circuits of a non-volatile semiconductor memory device according to a third embodiment of the present invention.

FIG. 12 is a diagram showing the constructions of a memory cell array and writing circuits of the flash memory (non-volatile semiconductor memory device) of the third embodiment. In FIG. 12, the constituent elements having the same functions as the second embodiment of FIG. 8 are represented by the same reference numerals, and the detailed description thereof is omitted. The different point of FIG. 12 from FIG. 8 showing the second embodiment resides in that a memory cell array 11 having a different construction is disposed in place of the memory cell array 10 and a select gate 25 and a single/multiple selecting select gate driver 26 are provided between the memory cell array 11 and the writing circuits 30a to 30d.

The memory cell array 11 is an NOR-type flash memory array, and memory cells M00 to M315 are disposed at the respective cross points of sub bit lines SBL0 to SBL15 and word lines WL0 to WL3. The sub bit lines SBL0 to SBL15 are connected to main bit lines MBL0 to MBL3 through the select gate 25. The sub bit lines SBL0 to SBL3 are connected to the common main bit line MBL0 through transistors SG0 to SG3 of the select gate 25. Likewise, the sub bit lines SBL4 to SBL7 are connected to the common main bit line MBL1 through the transistors SG0 to SG3 of the select gate 25, and the sub bit lines SBL8 to SBL11 are connected to the common main bit line MBL2 through the transistors SG0 to SG3 of the select gate 25. The sub bit lines SBL12 to SBL15 are connected to the common main bit line MBL3 through the transistors SG0 to SG3 of the select gate 25. The single/multiple selection select gate driver 26 drives control signals SS0 to SS3 to select a desired select gate and connect specific sub bit line and main bit line.

The writing circuits 30a to 30d are connected to the main bit lines MBL0 to MBL3 respectively. The writing circuits 30a to 30d are disposed every plural sub bit lines. That is, one writing circuit 30a is disposed in connection with the sub bit lines SBL0 to SBL3, one writing circuit 30b is disposed in connection with the sub bit lines SBL4 to SBL7, one writing circuit 30c is disposed in connection with the sub bit lines SBL8 to SBL11, and the writing circuit 30d is disposed in connection with the sub bit lines SBL12 to SBL15. When only one writing circuit is disposed every plural bit lines as described above, memory cells connected to one word line comprise plural pages. For example, memory cells connected to the word line WL0 comprises four pages of memory cells M00, M04, M08, M012 of page 0 selected by selecting the transistor SG0 of the select gate 25, memory cells M01, M05, M09, M013 of page 1 selected by selecting the transistor SG1 of the select gate 25, memory cells M02, M06, M010, M014 of page 2 selected by selecting the transistor SG2 of the select gate 25 and memory cells M03, M07, M11, M015 of page 3 selected by selecting the transistor SG3 of the select gate 25.

With respect to the non-volatile semiconductor memory device thus constructed, the writing operation of the logical checker pattern will be described hereunder. Here, the logical checker pattern is defined as a pattern in which the logical values of read-out data are inverted every adjacent bits and also the same bits are inverted every read-out cycle, for example, a pattern in which read-out data is changed like 55h→AAh→55h→AAh.

Figure 13:
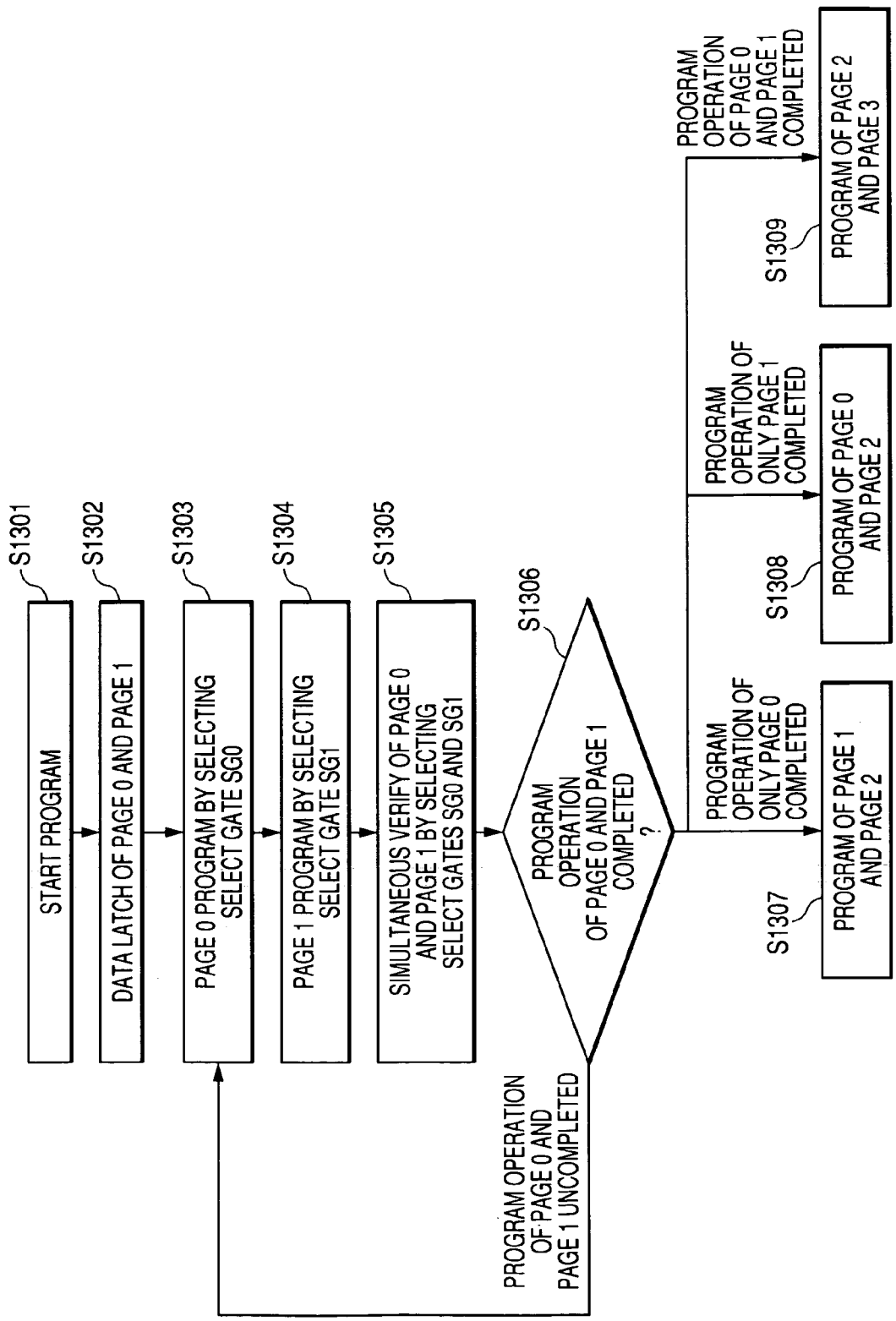
FIG. 13 is a flowchart showing the writing operation of a logical checker pattern of a non-volatile semiconductor memory device according to the third embodiment of the present invention.

FIG. 13 is a flowchart showing the writing operation of the logical checker pattern of the flash memory (non-volatile semiconductor storage device) according to the third embodiment of the present invention, and FIG. 14 is a diagram showing transition of memory cell data in the writing operation of the logical checker pattern of the flash memory (non-volatile semiconductor storage device) according to the third embodiment of the present invention, and memory cells to be subjected to the program operation and the verify operation. Only the memory cells M00 to M315 connected to the word lines WL0 to WL3, the sub bit lines SBL0 to SBL15 are shown in FIG. 14. As shown in FIG. 14(a), all the data of the memory cell array before the writing operation is carried out are 1-data (erase data). Here, the writing data of the logical checker pattern is a pattern as shown in FIG. 14(b). With such a writing pattern, the logical values of the read-out data are inverted every adjacent bits and also the same bits are inverted every read-out cycle.

When the writing operation is started (step S1301), the data latch operation is carried out on the writing circuits 30a to 30d disposed every main bit line (step S1302). As in the case of the second embodiment, 0-data (program data) is stored in all the writing circuits 30a to 30d. After the data latch operation is carried out, the word line WL0 and the transistor SG0 of the select gate 25 are selected, and the program operation for the page 0 connected to the word line WL0 and selected by the transistor SG0 of the select gate 25 is carried out (step S1303). Here, as in the case of the second embodiment, the writing operation is carried out while setting only the writing circuits 30a, 30c connected to the even-numbered main bit lines MBL0, MBL2 to the active state, whereby the program operation is carried out on only the memory cells M01 and M08 connected to the even-numbered main bit line MBL0, MBL2 as shown in FIG. 14 (c).

Subsequently, the program operation of page 1 connected to the word line WL0 and selected by the transistor SG1 of the select gate 25 is carried out (step S1304). Here, as in the case of the second embodiment, the writing operation is carried out while setting only the writing circuits 30b, 30d connected to the odd-numbered main bit lines MBL1, MBL3 to the active state, whereby the program operation is carried out on only the memory cells M05, M013 connected to the odd-numbered main bit lines MBL1, MBL3 as shown in FIG. 14(d).

After the program operation of the pages 0 and 1 is finished, all the writing circuits 30a to 30d are set to the active state and the transistors SG0, SG1 of the select gate 25 are simultaneously selected as shown in FIG. 14(e), whereby the simultaneous verify operation of the pages 0 and 1 is carried out (step S1305). Here, the verify operation is carried out while simultaneously selecting the two select gate transistors SG0, SG1, and thus two bits of memory cells per main bit line are verified. For example, with respect to the main bit line MBL0, the memory cells M00, M01 are simultaneously selected as memory cells to be verified. However, since the writing data is the logical checker pattern, 0-data (program data) is stored only one bit of memory cell even when two bits of memory cells are selected. Accordingly, it is possible to carry out the simultaneous verify operation of pages 0 and 1 based on the simultaneous selection of the select gate transistors SG0, SG1. That is, the writing circuit 30a carries out the verify operation of the memory cell M00 of the page 0, the writing circuit 30b carries out the verify operation of the memory cell M05 of the page 1, the writing circuit 30c carries out the verify operation of the memory cell M08 of the page 0, and the writing circuit 30d carries out the verify operation of the memory cell M013 of the page 1. The judgment of the simultaneous verify operation of the pages 0 and 1 is carried out by the verify judging circuit 41 (step S1306).

If it is judged in step S1306 that the program operation for the pages 0 and 1 is not completed, the program operation and the simultaneous verify operation for the pages 0 and 1 are carried out again (steps S1303 to S1306). If it is judged in step S1306 that the program operation of the page 0 is completed and the program operation of the page 1 is not completed, the page 1 for which the program operation is not completed and a new page 2 are subjected to the writing operation (step S1307). Likewise, if it is judged in step S1306 that the program operation of the page 1 is completed and the program operation for the page 0 is not completed, the page 0 for which the program operation is not completed and a new page 2 are subjected to the writing operation (step S1308). Furthermore, if it is judged in step S1306 that the program operation for the pages 0 and 1 is completed, the writing operation for the new pages 2 and 3 is carried out (step S1309). By repeating this operation, the writing operation of the logical checker pattern is carried out on all the memory cells.

As described above, according to the non-volatile semiconductor memory device of the third embodiment of the present invention, in the construction that at least one group writing circuits of the first group writing circuits connected to the even-numbered main bit lines and the second group writing circuits connected to the odd-numbered main bit lines can be set to the active state or non-active state, the writing operation of the logical checker pattern can be carried out by carrying out the data latch of writing data (0-data) on all the writing circuits, then selecting the first select gate and setting only the even-numbered writing circuits to the active state to carry out the writing operation on the first page, then selecting the second select gate and setting only the odd-numbered writing circuits to the active state to carry out the writing operation on the second page, and then simultaneously selecting the first and second select gates and setting all the writing circuits to the active state to carry out the simultaneous verify operation on the first and second pages. Accordingly, the data latch operation of the two pages of the first and second pages can be carried out by one data latch operation, and thus the data latch frequency can be reduced. Furthermore, the simultaneous verify operation of the first and second pages can be carried out by only one verify operation, and the verify frequency can be reduced. Accordingly, the data writing operation speed can be increased.

Furthermore, in the third embodiment, by setting the first sub bit line and the second sub bit line to be subjected to the program operation and the simultaneous verify operation so that they are not adjacent to each other, it is possible to carry out the simultaneous verify operation while selecting two sub bit lines which are not adjacent to each other and detect the short-circuit between the sub bit lines which is the purpose of the writing of the logical checker pattern carried out in the inspection process. Therefore, this embodiment can be used with no problem in the inspection process. Accordingly, the data writing operation speed can be increased, and the inspection time can be shortened.

Still furthermore, in the third embodiment, when the writing operation of the first group writing circuits connected to the even-numbered main bit lines or the second group writing circuits connected to the odd-numbered main bit lines is completed, the writing data of a new page is set to the writing circuits of the group for which the writing operation is completed. Therefore, when the wiring operation for any page is completed, the writing operation for a next page can be carried out without waiting for the writing operation of a page for which the writing operation is not completed, so that the parallel degree of the writing operation can be enhanced, and the writing operation speed can be further increased.

The present invention is not limited to the above embodiments, and various modifications may be made without departing from the subject matter of the present invention. For example, the foregoing description is made by using the NOR type memory cell array of the non-volatile semiconductor memory device. However, the present invention may be applied in a case where the memory cell array is of a NAND type, an AND type or the like. Furthermore, the foregoing description is made by using the writing circuits of the non-volatile semiconductor memory device constructed as shown in FIGS. 4, 8 and 12. However, the present invention may be applied to writing circuits which have the same functions (data latch operation, program operation, verify operation) and different construction.

According to the non-volatile semiconductor memory device and the writing method therefore according to the present invention, the data latch operation of plural pages can be carried out all at once, and further the verify operation is carried out while selecting plural word lines or select gates and setting all the writing circuits to the active state, whereby the simultaneous verify operation can be carried out on plural pages, and the data latch frequency and the verify frequency can be reduced, and also the present invention is effectively applied as the non-volatile semiconductor memory device and the writing method therefore in which high-speed writing of the physical checker pattern, the logical checker pattern, etc. can be performed.

What is claimed is:

1. A non-volatile semiconductor memory device comprising:
   a memory cell array, having plural memory cells arranged in a matrix form at the respective cross points of plural word lines and plural bit lines;
   a word line selector, selecting one or two word lines from the plural word lines;
   a first group writing unit, respectively connected to even-numbered bit lines and carrying out a program operation and a program verify operation to writing data into memory cells of a first group connected to even-numbered bit lines;
   a second group writing unit, respectively connected to odd-numbered bit lines and carrying out a program operation and a program verify operation to writing data into memory cells of a second group connected to odd-numbered bit lines;
   a controller, setting a first word line to a selective state, the first group writing unit to an operative state, and the second group writing unit to a halting state, and carrying out a writing operation of a first page connected to the first word line,
   setting a second word line to a selective state, the second group writing unit to an operative state, and the first group writing unit to a halting state, and carrying out a writing operation of a second page connected to the second word line, and
   setting the first and second word lines to a selective state, the first and second group writing units to an operative state, and carrying out a program verify operation of the first and second page.

2. The non-volatile semiconductor memory device according to claim 1, wherein the writing units comprise:
   a latch circuit, storing the writing data; and
   a bit line connecting circuit, which connects and disconnects the latch circuit to the bit lines; and
   when the writing units are in the operative state, the latch circuit and the bit lines are connected by the bit line connecting circuit;
   when the writing units are in the halting state, the latch circuit and the bit lines are disconnected by the bit line connecting circuit.

3. The non-volatile semiconductor memory device according to claim 1, wherein the writing data is a physical checker pattern comparing a checkered pattern.

4. The non-volatile semiconductor memory device according to claim 1, wherein the word line selector selects word lines which are not adjacent to one another.

5. The non-volatile semiconductor memory device according to claim 1, further comprising:
   a voltage generating circuit, continually generating voltages needed for the writing operation into the first group memory cells and the writing operation into the second group-memory cells.

6. The non-volatile semiconductor memory device according to claim 1, further comprising:
   a first detector, detecting completion of the writing operation to memory cells of the first group;
   a second detector, detecting completion of the writing operation to memory cells of the second group; and
   a writing data setter, setting, on the basis of the outputs of the first and second detector, writing data of a new page to the writing unit of a group for which the writing operation has been completed.

7. The non-volatile semiconductor memory device according to claim 6, wherein the first detector detects completion of the writing operation by referring to the data stored in the latch circuit of the first group writing unit, and the second detector detects completion of the writing operation by referring to the data stored in the latch circuit of the second group writing unit.

8. The non-volatile semiconductor memory device according to claim 1, further comprising:
   a first writing data setter, setting writing data to the first group writing unit in a lump;
   a second writing data setter, setting writing data to the second group writing unit in a lump; and
   a data setter activation state setter, setting at least one of the first writing data setter and the second writing data setter to an active state or non-active state.

9. A writing method for the non-volatile semiconductor memory device according to claim 1, comprising the steps of:

setting a first word line to a selective state, the first group writing unit to an operative state, and the second group writing unit to a halting state, and carrying out a writing operation of a first page connected to the first word line, setting a second word line to a selective state, the second group writing unit to an operative state, and the first group writing unit to a halting state, and carrying out a writing operation of a second page connected to the second word line, and setting the first and second word lines to a selective state, the first and second group writing units to an operative state, carrying out a program verify operation of the first and second page.

10. A non-volatile semiconductor memory device comprising:

a memory cell array, having plural memory cells arranged in a matrix form at the respective cross points of plural word lines and plural sub bit lines;

plural select transistors, respectively connecting plural main bit lines and the plural sub bit lines;

a select transistors selecting unit, selecting one or two select transistors from the plural select transistors;

a first group writing unit, respectively connected to even-numbered main bit lines and carrying out a program operation and a program verify operation to writing data into memory cells of a first group connected to even-numbered main bit lines;

a second group writing unit, respectively connected to odd-numbered main bit lines and carrying out a program operation and a program verify operation to writing data into memory cells of a second group connected to odd-numbered main bit lines;

a controller, setting a first select transistor to a selective state, the first group writing unit to an operative state, and the second group writing unit to a halting state, and carrying out a writing operation of a first page connected to the first select transistor, setting a second select transistors to a selective state, the second group writing unit to an operative state, and the first group writing unit to a halting state, and carrying out a writing operation of a second page connected to the second select transistor, and setting the first and second select transistors to a selective state, the first and second group writing units to an operative state, and carrying out a program verify operation of the first and second page.

11. The non-volatile semiconductor memory device according to claim 10, wherein the writing units comprises:

a latch circuit, storing the writing data; and a bit line connecting circuit, which connects and disconnects the latch circuit to the main bit lines; and when the writing units are in the operative state, the latch circuit and the main bit lines are connected by the bit line connecting circuit;

when the writing units are in the halting state, the latch circuit and the main bit lines are disconnected by the bit line connecting circuit.

12. The non-volatile semiconductor memory device according to claim 10, wherein the writing data is a logical checker pattern in which logical values of read-out data are inverted every adjacent bits and the same bits are inverted every read-out cycle.

13. The non-volatile semiconductor memory device according to claim 10, wherein the select gate selector selects sub bit lines which are not adjacent to one another.

14. The writing method for the non-volatile semiconductor memory device according to claim 10, comprising:

setting a first select transistor to a selective state, the first group writing unit to an operative state, and the second group writing unit to a halting state, and carrying out a writing operation of a first page connected to the first select transistor, setting a second select transistors to a selective state, the second group writing unit to an operative state, and the first group writing unit to a halting state, and carrying out a writing operation of a second page connected to the second select transistor, and setting the first and second select transistors to a selective state, the first and second group writing units to an operative state, and carrying out a program verify operation of the first and second.

15. The non-volatile semiconductor memory device according to claim 10, further comprising:

a voltage generating circuit, continually generating voltages needed for the writing operation into the first group memory cells and the writing operation into the second group-memory cells.

16. The non-volatile semiconductor memory device according to claim 10, further comprising:

a first detector, detecting completion of the writing operation to memory cells of the first group;

a second detector, detecting completion of the writing operation to memory cells of the second group; and a writing data setter, setting, on the basis of the outputs of the first and second detector, writing data of a new page to the writing unit of a group for which the writing operation has been completed.

17. The non-volatile semiconductor memory device according to claim 10, further comprising:

a first writing data setter, setting writing data to the first group writing unit in a lump;

a second writing data setter, setting writing data to the second group writing unit in a lump; and a data setter activation state setter, setting at least one of the first writing data setter and the second writing data setter to an active state or non-active state.

* * * * *